United States Patent
Shanmugasundram et al.

(10) Patent No.: US 7,082,345 B2
(45) Date of Patent: Jul. 25, 2006

(54) METHOD, SYSTEM AND MEDIUM FOR PROCESS CONTROL FOR THE MATCHING OF TOOLS, CHAMBERS AND/OR OTHER SEMICONDUCTOR-RELATED ENTITIES

(75) Inventors: Arulkumar P. Shanmugasundram, Sunnyvale, CA (US); Helen Armer, Cupertino, CA (US); Alexander T. Schwarm, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/172,977

(22) Filed: Jun. 18, 2002

(65) Prior Publication Data

US 2002/0199082 A1 Dec. 26, 2002

Related U.S. Application Data

(60) Provisional application No. 60/365,782, filed on Mar. 21, 2002, provisional application No. 60/298,878, filed on Jun. 19, 2001.

(51) Int. Cl.
*G06F 19/00* (2006.01)
*G05B 13/02* (2006.01)

(52) U.S. Cl. .................. 700/121; 700/31; 700/110

(58) Field of Classification Search .............. 700/9, 700/19, 20, 31, 32, 108–110, 121; 438/5
See application file for complete search history.

(56) References Cited

U.S. PATENT DOCUMENTS

| | | | |
|---|---|---|---|
| 3,767,900 A | 10/1973 | Chao et al. |
| 3,920,965 A | 11/1975 | Sohrwardy |
| 4,207,520 A | 6/1980 | Flora et al. |
| 4,209,744 A | 6/1980 | Gerasimov et al. |
| 4,368,510 A | 1/1983 | Anderson |
| 4,609,870 A | 9/1986 | Lale et al. |
| 4,616,308 A | 10/1986 | Morshedi et al. |
| 4,663,703 A | 5/1987 | Axelby et al. |

(Continued)

FOREIGN PATENT DOCUMENTS

CA 2050247 8/1991

(Continued)

OTHER PUBLICATIONS

Levine, Martin D. 1985. *Vision in Man and Machine*. New York: McGraw-Hill, Inc. pp. ix-xii, 1-58.

(Continued)

*Primary Examiner*—Paul Rodriguez
(74) *Attorney, Agent, or Firm*—Wilmer Culter Pickering Hale & Dorr

(57) ABSTRACT

The invention relates to a method, system and computer program useful for producing a product, such as a microelectronic device, for example in an assembly line, where the production facility includes parallel production of assembly lines of products on identically configured chambers, tools and/or modules. Control is provided between such chambers. Behaviors of a batch of wafers (or of each wafer) are collected as the first batch (or each wafer) is processed by one of the identically configured chambers in one assembly line to produce the microelectronic device. The information relating to the behavior is shared with a controller of another one (or more) of the identically configured chambers, process tools and/or modules, to provide an adjustment of the process tool and thereby to produce a second batch (or next wafer) which is substantially identical, within tolerance, to the first batch (or wafer).

43 Claims, 16 Drawing Sheets

U.S. PATENT DOCUMENTS

| | | |
|---|---|---|
| 4,698,766 A | 10/1987 | Entwistle et al. |
| 4,755,753 A | 7/1988 | Chern |
| 4,796,194 A | 1/1989 | Atherton |
| 4,901,218 A | 2/1990 | Cornwell |
| 4,957,605 A | 9/1990 | Hurwitt et al. |
| 4,967,381 A | 10/1990 | Lane et al. |
| 5,014,208 A | 5/1991 | Wolfson |
| 5,089,970 A | 2/1992 | Lee et al. |
| 5,108,570 A | 4/1992 | Wang |
| 5,128,588 A | 7/1992 | Kameya et al. |
| 5,208,765 A | 5/1993 | Turnbull |
| 5,220,517 A | 6/1993 | Sierk et al. |
| 5,226,118 A | 7/1993 | Baker et al. |
| 5,231,585 A | 7/1993 | Kobayashi et al. |
| 5,236,868 A | 8/1993 | Nulman |
| 5,240,552 A | 8/1993 | Yu et al. |
| 5,260,868 A | 11/1993 | Gupta et al. |
| 5,270,222 A | 12/1993 | Moslehi |
| 5,295,242 A | 3/1994 | Mashruwala et al. |
| 5,305,221 A | 4/1994 | Atherton |
| 5,309,221 A | 5/1994 | Fischer et al. |
| 5,329,463 A | 7/1994 | Sierk et al. |
| 5,347,446 A | 9/1994 | Iino et al. |
| 5,367,624 A | 11/1994 | Cooper |
| 5,369,544 A | 11/1994 | Mastrangelo |
| 5,375,064 A | 12/1994 | Bollinger |
| 5,398,336 A | 3/1995 | Tantry et al. |
| 5,402,367 A | 3/1995 | Sullivan et al. |
| 5,408,405 A | 4/1995 | Mozumder et al. |
| 5,410,473 A | 4/1995 | Kaneko et al. |
| 5,420,796 A | 5/1995 | Weling et al. |
| 5,427,878 A | 6/1995 | Corliss |
| 5,444,632 A | 8/1995 | Kline et al. |
| 5,444,837 A | 8/1995 | Bomans et al. |
| 5,469,361 A | 11/1995 | Moyne ................ 700/95 |
| 5,490,097 A | 2/1996 | Swenson et al. |
| 5,495,417 A | 2/1996 | Fuduka et al. |
| 5,497,316 A | 3/1996 | Sierk et al. |
| 5,503,707 A | 4/1996 | Maung et al. |
| 5,508,947 A | 4/1996 | Sierk et al. |
| 5,519,605 A | 5/1996 | Cawlfield |
| 5,525,808 A | 6/1996 | Irie et al. |
| 5,526,293 A | 6/1996 | Mozumder et al. |
| 5,534,289 A | 7/1996 | Bilder et al. |
| 5,546,326 A | 8/1996 | Tai et al. |
| 5,586,039 A | 12/1996 | Hirsch et al. |
| 5,599,423 A | 2/1997 | Parker et al. |
| 5,603,707 A | 2/1997 | Trombetta et al. |
| 5,617,321 A | 4/1997 | Frizelle et al. |
| 5,629,216 A | 5/1997 | Wijaranakula et al. |
| 5,655,951 A | 8/1997 | Meikle et al. |
| 5,657,254 A | 8/1997 | Sierk et al. |
| 5,661,669 A | 8/1997 | Mozumder et al. ......... 702/84 |
| 5,664,987 A | 9/1997 | Renteln |
| 5,665,214 A | 9/1997 | Iturralde |
| 5,667,424 A | 9/1997 | Pan |
| 5,674,787 A | 10/1997 | Zhao et al. |
| 5,689,432 A | 11/1997 | Blaauw et al. |
| 5,694,325 A | 12/1997 | Fukuda et al. |
| 5,695,810 A | 12/1997 | Dubin et al. |
| 5,698,989 A | 12/1997 | Nulman |
| 5,719,495 A | 2/1998 | Moslehi |
| 5,719,796 A | 2/1998 | Chen |
| 5,735,055 A | 4/1998 | Hochbein et al. |
| 5,740,429 A | 4/1998 | Wang et al. |
| 5,751,582 A | 5/1998 | Saxena et al. |
| 5,754,297 A | 5/1998 | Nulman |
| 5,761,064 A | 6/1998 | La et al. |
| 5,761,065 A | 6/1998 | Kittler et al. |
| 5,764,543 A | 6/1998 | Kennedy |
| 5,777,901 A | 7/1998 | Berezin et al. |
| 5,781,454 A | 7/1998 | Alexander |
| 5,787,021 A | 7/1998 | Samaha |
| 5,787,269 A | 7/1998 | Hyodo |
| 5,808,303 A | 9/1998 | Schlagheck et al. |
| 5,812,407 A | 9/1998 | Sato et al. |
| 5,823,854 A | 10/1998 | Chen |
| 5,824,599 A | 10/1998 | Schacham-Diamand et al. |
| 5,825,356 A | 10/1998 | Habib et al. |
| 5,825,913 A | 10/1998 | Rostami et al. |
| 5,828,778 A | 10/1998 | Hagi et al. |
| 5,831,851 A | 11/1998 | Eastburn et al. |
| 5,832,224 A | 11/1998 | Fehskens et al. |
| 5,838,595 A | 11/1998 | Sullivan et al. |
| 5,838,951 A | 11/1998 | Song |
| 5,844,554 A | 12/1998 | Geller et al. |
| 5,857,258 A | 1/1999 | Penzes et al. |
| 5,859,777 A | 1/1999 | Yokoyama et al. |
| 5,859,964 A | 1/1999 | Wang et al. |
| 5,859,975 A | 1/1999 | Brewer et al. |
| 5,862,054 A | 1/1999 | Li |
| 5,863,807 A | 1/1999 | Jang et al. |
| 5,867,389 A * | 2/1999 | Hamada et al. ............. 700/121 |
| 5,870,306 A | 2/1999 | Harada |
| 5,871,805 A | 2/1999 | Lemelson |
| 5,883,437 A | 3/1999 | Maruyama et al. |
| 5,889,991 A | 3/1999 | Consolatti et al. |
| 5,901,313 A | 5/1999 | Wolf et al. |
| 5,903,455 A | 5/1999 | Sharpe, Jr. et al. |
| 5,910,011 A | 6/1999 | Cruse |
| 5,910,846 A | 6/1999 | Sandhu |
| 5,912,678 A | 6/1999 | Saxena et al. |
| 5,914,879 A | 6/1999 | Wang et al. |
| 5,916,016 A | 6/1999 | Bothra |
| 5,923,553 A | 7/1999 | Yi |
| 5,926,690 A | 7/1999 | Toprac et al. |
| 5,930,138 A | 7/1999 | Lin et al. |
| 5,940,300 A | 8/1999 | Ozaki |
| 5,943,237 A | 8/1999 | Van Boxem |
| 5,943,550 A | 8/1999 | Fulford, Jr. et al. |
| 5,960,185 A | 9/1999 | Nguyen |
| 5,960,214 A | 9/1999 | Sharpe, Jr. et al. |
| 5,961,369 A | 10/1999 | Bartels et al. |
| 5,963,881 A | 10/1999 | Kahn et al. |
| 5,975,994 A | 11/1999 | Sandhu et al. |
| 5,978,751 A | 11/1999 | Pence et al. |
| 5,982,920 A | 11/1999 | Tobin, Jr. et al. |
| 6,002,989 A | 12/1999 | Shiba et al. |
| 6,012,048 A | 1/2000 | Gustin et al. |
| 6,017,771 A | 1/2000 | Yang et al. |
| 6,036,349 A | 3/2000 | Gombar |
| 6,037,664 A | 3/2000 | Zhao et al. |
| 6,041,263 A * | 3/2000 | Boston et al. .............. 700/121 |
| 6,041,270 A | 3/2000 | Steffan et al. |
| 6,054,379 A | 4/2000 | Yau et al. |
| 6,059,636 A | 5/2000 | Inaba et al. |
| 6,064,759 A | 5/2000 | Buckley et al. |
| 6,072,313 A | 6/2000 | Li et al. |
| 6,074,443 A | 6/2000 | Venkatesh et al. |
| 6,077,412 A * | 6/2000 | Ting et al. .................. 205/143 |
| 6,078,845 A | 6/2000 | Friedman |
| 6,094,688 A | 7/2000 | Mellen-Garnett et al. |
| 6,096,649 A | 8/2000 | Jang |
| 6,097,887 A | 8/2000 | Hardikar et al. |
| 6,100,195 A | 8/2000 | Chan et al. |
| 6,108,092 A | 8/2000 | Sandhu |
| 6,111,634 A | 8/2000 | Pecen et al. |
| 6,112,130 A | 8/2000 | Fukuda et al. |
| 6,113,462 A | 9/2000 | Yang |
| 6,114,238 A | 9/2000 | Liao |
| 6,127,263 A | 10/2000 | Parikh |
| 6,128,016 A | 10/2000 | Coelho et al. |
| 6,136,163 A | 10/2000 | Cheung et al. |
| 6,141,660 A | 10/2000 | Bach et al. |

| | | | |
|---|---|---|---|
| 6,143,646 A | 11/2000 | Wetzel | |
| 6,148,099 A | 11/2000 | Lee et al. | |
| 6,148,239 A * | 11/2000 | Funk et al. ............... 700/1 | |
| 6,148,246 A | 11/2000 | Kawazome | |
| 6,150,270 A | 11/2000 | Matsuda et al. | |
| 6,157,864 A | 12/2000 | Schwenke et al. | |
| 6,159,075 A | 12/2000 | Zhang | |
| 6,159,644 A | 12/2000 | Satoh et al. | |
| 6,161,054 A * | 12/2000 | Rosenthal et al. ....... 700/121 | |
| 6,169,931 B1 | 1/2001 | Runnels | |
| 6,172,756 B1 | 1/2001 | Chalmers et al. | |
| 6,173,240 B1 | 1/2001 | Sepulveda et al. | |
| 6,175,777 B1 | 1/2001 | Kim | |
| 6,178,390 B1 | 1/2001 | Jun | |
| 6,181,013 B1 | 1/2001 | Liu et al. | |
| 6,183,345 B1 | 2/2001 | Kamono et al. | |
| 6,185,324 B1 | 2/2001 | Ishihara et al. | |
| 6,191,864 B1 | 2/2001 | Sandhu | |
| 6,192,291 B1 | 2/2001 | Kwon | |
| 6,197,604 B1 * | 3/2001 | Miller et al. ............... 438/14 | |
| 6,204,165 B1 | 3/2001 | Ghoshal | |
| 6,210,983 B1 | 4/2001 | Atchison et al. | |
| 6,211,094 B1 | 4/2001 | Jun et al. ............... 438/758 | |
| 6,212,961 B1 | 4/2001 | Dvir | |
| 6,214,734 B1 | 4/2001 | Bothra et al. | |
| 6,217,412 B1 | 4/2001 | Campbell et al. | |
| 6,219,711 B1 | 4/2001 | Chari | |
| 6,222,936 B1 | 4/2001 | Phan et al. | |
| 6,226,563 B1 | 5/2001 | Lim | |
| 6,226,792 B1 | 5/2001 | Goiffon et al. | |
| 6,228,280 B1 | 5/2001 | Li et al. | |
| 6,230,069 B1 | 5/2001 | Campbell et al. | |
| 6,236,903 B1 | 5/2001 | Kim et al. | |
| 6,237,050 B1 | 5/2001 | Kim et al. | |
| 6,238,937 B1 | 5/2001 | Toprac et al. | |
| 6,240,328 B1 | 5/2001 | LaLonde et al. | |
| 6,240,330 B1 | 5/2001 | Kurtzberg et al. | |
| 6,240,331 B1 | 5/2001 | Yun ............... 700/121 | |
| 6,245,581 B1 | 6/2001 | Bonser et al. | |
| 6,246,972 B1 | 6/2001 | Klimasauskas | |
| 6,248,602 B1 | 6/2001 | Bode et al. | |
| 6,249,712 B1 | 6/2001 | Boiquaye | |
| 6,252,412 B1 | 6/2001 | Talbot et al. | |
| 6,253,366 B1 | 6/2001 | Mutschler, III | |
| 6,259,160 B1 | 7/2001 | Lopatin et al. | |
| 6,263,255 B1 | 7/2001 | Tan et al. | |
| 6,268,270 B1 | 7/2001 | Scheid et al. | |
| 6,271,670 B1 | 8/2001 | Caffey | |
| 6,276,989 B1 | 8/2001 | Campbell et al. | |
| 6,277,014 B1 | 8/2001 | Chen et al. | |
| 6,278,899 B1 | 8/2001 | Piche et al. | |
| 6,280,289 B1 | 8/2001 | Wiswesser et al. | |
| 6,281,127 B1 | 8/2001 | Shue | |
| 6,284,622 B1 | 9/2001 | Campbell et al. | |
| 6,287,879 B1 | 9/2001 | Gonzales et al. | |
| 6,290,572 B1 | 9/2001 | Hofmann | |
| 6,291,367 B1 | 9/2001 | Kelkar | |
| 6,292,708 B1 | 9/2001 | Allen et al. ............... 700/121 | |
| 6,298,274 B1 | 10/2001 | Inoue | |
| 6,298,470 B1 | 10/2001 | Breiner et al. | |
| 6,303,395 B1 | 10/2001 | Nulman | |
| 6,304,999 B1 | 10/2001 | Toprac et al. | |
| 6,307,628 B1 | 10/2001 | Lu et al. | |
| 6,314,379 B1 | 11/2001 | Hu et al. | |
| 6,317,643 B1 | 11/2001 | Dmochowski | |
| 6,320,655 B1 | 11/2001 | Matsushita et al. | |
| 6,324,481 B1 | 11/2001 | Atchison et al. | |
| 6,334,807 B1 | 1/2002 | Lebel et al. | |
| 6,336,841 B1 | 1/2002 | Chang | |
| 6,339,727 B1 | 1/2002 | Ladd | |
| 6,340,602 B1 | 1/2002 | Johnson et al. | |
| 6,345,288 B1 | 2/2002 | Reed et al. | |
| 6,345,315 B1 | 2/2002 | Mishra | |
| 6,346,426 B1 | 2/2002 | Toprac et al. | |
| 6,355,559 B1 | 3/2002 | Havemann et al. | |
| 6,360,133 B1 | 3/2002 | Campbell et al. | |
| 6,360,184 B1 | 3/2002 | Jacquez | |
| 6,363,294 B1 | 3/2002 | Coronel et al. | |
| 6,366,934 B1 | 4/2002 | Cheng et al. | |
| 6,368,879 B1 | 4/2002 | Toprac | |
| 6,368,883 B1 | 4/2002 | Bode et al. | |
| 6,368,884 B1 | 4/2002 | Goodwin et al. | |
| 6,379,980 B1 | 4/2002 | Toprac | |
| 6,381,564 B1 | 4/2002 | Davis et al. | |
| 6,388,253 B1 | 5/2002 | Su | |
| 6,389,491 B1 | 5/2002 | Jacobson et al. | |
| 6,391,780 B1 | 5/2002 | Shih et al. | |
| 6,395,152 B1 | 5/2002 | Wang | |
| 6,397,114 B1 | 5/2002 | Eryurek et al. | |
| 6,400,162 B1 | 6/2002 | Mallory et al. | |
| 6,405,096 B1 * | 6/2002 | Toprac et al. ............... 700/121 |
| 6,405,144 B1 | 6/2002 | Toprac et al. | |
| 6,417,014 B1 | 7/2002 | Lam et al. | |
| 6,427,093 B1 | 7/2002 | Toprac | |
| 6,432,728 B1 | 8/2002 | Tai et al. | |
| 6,435,952 B1 | 8/2002 | Boyd et al. | |
| 6,438,438 B1 | 8/2002 | Takagi et al. | |
| 6,440,295 B1 | 8/2002 | Wang | |
| 6,442,496 B1 | 8/2002 | Pasadyn et al. | |
| 6,449,524 B1 | 9/2002 | Miller et al. | |
| 6,455,415 B1 | 9/2002 | Lopatin et al. | |
| 6,455,937 B1 | 9/2002 | Cunningham | |
| 6,465,263 B1 | 10/2002 | Coss, Jr. et al. | |
| 6,470,230 B1 | 10/2002 | Toprac et al. | |
| 6,479,902 B1 | 11/2002 | Lopatin et al. | |
| 6,479,990 B1 | 11/2002 | Mednikov et al. | |
| 6,482,660 B1 | 11/2002 | Conchieri et al. | |
| 6,484,064 B1 | 11/2002 | Campbell | |
| 6,486,492 B1 | 11/2002 | Su | |
| 6,492,281 B1 | 12/2002 | Song et al. | |
| 6,495,452 B1 | 12/2002 | Shih | |
| 6,503,839 B1 | 1/2003 | Gonzales et al. | |
| 6,515,368 B1 | 2/2003 | Lopatin et al. | |
| 6,517,413 B1 | 2/2003 | Hu et al. | |
| 6,517,414 B1 | 2/2003 | Tobin et al. | |
| 6,528,409 B1 | 3/2003 | Lopatin et al. | |
| 6,529,789 B1 | 3/2003 | Campbell et al. | |
| 6,532,555 B1 | 3/2003 | Miller et al. | |
| 6,535,783 B1 | 3/2003 | Miller et al. | |
| 6,537,912 B1 | 3/2003 | Agarwal | |
| 6,540,591 B1 | 4/2003 | Pasadyn et al. | |
| 6,541,401 B1 | 4/2003 | Herner et al. | |
| 6,546,508 B1 | 4/2003 | Sonderman et al. | |
| 6,556,881 B1 | 4/2003 | Miller | |
| 6,560,504 B1 | 5/2003 | Goodwin et al. | |
| 6,563,308 B1 | 5/2003 | Nagano et al. | |
| 6,567,717 B1 | 5/2003 | Krivokapic et al. | |
| 6,580,958 B1 | 6/2003 | Takano | |
| 6,587,744 B1 * | 7/2003 | Stoddard et al. ............ 700/121 |
| 6,588,007 B1 | 7/2003 | Pasadyn et al. | |
| 6,590,179 B1 | 7/2003 | Tanaka et al. | |
| 6,604,012 B1 | 8/2003 | Cho et al. | |
| 6,605,549 B1 | 8/2003 | Leu et al. | |
| 6,607,976 B1 | 8/2003 | Chen et al. | |
| 6,609,946 B1 | 8/2003 | Tran | |
| 6,616,513 B1 | 9/2003 | Osterheld | |
| 6,618,692 B1 | 9/2003 | Takahashi et al. | |
| 6,624,075 B1 | 9/2003 | Lopatin et al. | |
| 6,625,497 B1 | 9/2003 | Fairbairn et al. | |
| 6,630,741 B1 | 10/2003 | Lopatin et al. | |
| 6,640,151 B1 | 10/2003 | Somekh et al. | |
| 6,652,355 B1 | 11/2003 | Wiswesser et al. | |
| 6,660,633 B1 | 12/2003 | Lopatin et al. | |
| 6,678,570 B1 | 1/2004 | Pasadyn et al. | |
| 6,708,074 B1 | 3/2004 | Chi et al. | |
| 6,708,075 B1 | 3/2004 | Sonderman et al. | |

| | | | |
|---|---|---|---|
| 6,725,402 B1 | 4/2004 | Coss, Jr. et al. | |
| 6,728,587 B1 | 4/2004 | Goldman et al. | 700/108 |
| 6,735,492 B1 | 5/2004 | Conrad et al. | |
| 6,751,518 B1 | 6/2004 | Sonderman et al. | 700/121 |
| 6,774,998 B1 | 8/2004 | Wright et al. | |
| 6,842,659 B1 * | 1/2005 | Parikh et al. | 700/121 |
| 2001/0001755 A1 | 5/2001 | Sandhu et al. | |
| 2001/0003084 A1 | 6/2001 | Finarov | |
| 2001/0006873 A1 | 7/2001 | Moore | |
| 2001/0030366 A1 | 10/2001 | Nakano et al. | |
| 2001/0039462 A1 | 11/2001 | Mendez et al. | |
| 2001/0040997 A1 | 11/2001 | Tsap et al. | |
| 2001/0042690 A1 | 11/2001 | Talish | |
| 2001/0044667 A1 | 11/2001 | Nakano et al. | |
| 2002/0032499 A1 | 3/2002 | Wilson et al | |
| 2002/0058460 A1 | 5/2002 | Lee et al. | |
| 2002/0070126 A1 | 6/2002 | Sato et al. | |
| 2002/0077031 A1 | 6/2002 | Johansson et al. | |
| 2002/0081951 A1 | 6/2002 | Boyd et al. | |
| 2002/0089676 A1 | 7/2002 | Pecen et al. | |
| 2002/0102853 A1 | 8/2002 | Li et al. | |
| 2002/0107599 A1 | 8/2002 | Patel et al. | |
| 2002/0107604 A1 | 8/2002 | Riley et al. | |
| 2002/0113039 A1 | 8/2002 | Mok et al. | |
| 2002/0127950 A1 | 9/2002 | Hirose et al. | |
| 2002/0128805 A1 | 9/2002 | Goldman et al. | |
| 2002/0149359 A1 | 10/2002 | Crouzen et al. | |
| 2002/0165636 A1 | 11/2002 | Hasan | 700/121 |
| 2002/0183986 A1 | 12/2002 | Stewart et al. | |
| 2002/0185658 A1 | 12/2002 | Inoue et al. | |
| 2002/0193899 A1 | 12/2002 | Shanmugasundram et al. | |
| 2002/0197745 A1 | 12/2002 | Shanmugasundram et al. | |
| 2002/0197934 A1 | 12/2002 | Paik | |
| 2002/0199082 A1 | 12/2002 | Shanmugasundram et al. | |
| 2003/0017256 A1 | 1/2003 | Shimane | |
| 2003/0020909 A1 | 1/2003 | Adams et al. | |
| 2003/0020928 A1 | 1/2003 | Ritzdorf et al. | |
| 2003/0154062 A1 | 8/2003 | Daft et al. | |

FOREIGN PATENT DOCUMENTS

| | | |
|---|---|---|
| CA | 2165847 | 8/1991 |
| CA | 2194855 | 8/1991 |
| EP | 0 397 924 A1 | 11/1990 |
| EP | 0 621 522 A2 | 10/1994 |
| EP | 0 747 795 A2 | 12/1996 |
| EP | 0 869 652 | 10/1998 |
| EP | 0 877 308 A2 | 11/1998 |
| EP | 0 881 040 A2 | 12/1998 |
| EP | 0 895 145 A1 | 2/1999 |
| EP | 0 910 123 | 4/1999 |
| EP | 0 932 194 | 7/1999 |
| EP | 0 932 195 A1 | 7/1999 |
| EP | 1 066 925 A2 | 1/2001 |
| EP | 1 067 757 | 1/2001 |
| EP | 1 071 128 | 1/2001 |
| EP | 1 083 470 A2 | 3/2001 |
| EP | 1 092 505 A2 | 4/2001 |
| EP | 1072967 A3 | 11/2001 |
| EP | 1 182 526 A2 | 2/2002 |
| GB | 2 347 885 A | 9/2000 |
| GB | 2 365 215 A | 2/2002 |
| JP | 61-66104 | 4/1986 |
| JP | 61-171147 | 8/1986 |
| JP | 01-283934 | 11/1989 |
| JP | 3-202710 | 9/1991 |
| JP | 05-151231 | 6/1993 |
| JP | 05-216896 | 8/1993 |
| JP | 05-266029 | 10/1993 |
| JP | 06-110894 | 4/1994 |
| JP | 06-176994 | 6/1994 |
| JP | 06-184434 | 7/1994 |
| JP | 06-252236 | 9/1994 |
| JP | 06-260380 | 9/1994 |
| JP | 08-50161 | 2/1996 |
| JP | 08-149583 | 6/1996 |
| JP | 08-304023 | 11/1996 |
| JP | 09-34535 | 2/1997 |
| JP | 10-173029 | 6/1998 |
| JP | 11-67853 | 3/1999 |
| JP | 11-126816 | 5/1999 |
| JP | 11-135601 | 5/1999 |
| JP | 2001-76982 | 3/2001 |
| JP | 2001-305108 | 10/2001 |
| WO | WO 95/34866 | 12/1995 |
| WO | WO 98/05066 | 2/1998 |
| WO | WO 98/45090 | 10/1998 |
| WO | WO 99/09371 | 2/1999 |
| WO | WO 99/25520 | 5/1999 |
| WO | WO 00/00874 | 1/2000 |
| WO | WO 00/05759 | 2/2000 |
| WO | WO 00/35063 | 6/2000 |
| WO | WO 00/54325 | 9/2000 |
| WO | WO 00/79355 A1 | 12/2000 |
| WO | WO 01/11679 | 2/2001 |
| WO | WO 01/15865 A1 | 3/2001 |
| WO | WO 01/18623 | 3/2001 |
| WO | WO 01/25865 | 4/2001 |
| WO | WO 01/33277 | 5/2001 |
| WO | WO 01/33501 A1 | 5/2001 |
| WO | WO 01/50206 A1 | 7/2001 |
| WO | WO 01/52055 A3 | 7/2001 |
| WO | WO 01/57823 A2 | 8/2001 |
| WO | WO 01/080306 | 10/2001 |
| WO | WO 02/17150 A1 | 2/2002 |
| WO | WO 02/31613 | 4/2002 |
| WO | WO 02/31613 A2 | 4/2002 |
| WO | WO 02/33737 A2 | 4/2002 |

OTHER PUBLICATIONS

Pilu, Maurizio. Sep. 2001. "Undoing Page Curl Distortion Using Applicable Surfaces." *IEEE International Conference on Image Processing*. Thessalonica, Greece.

May 23, 2003. Written Opinion for PCT/US01/24910.

Jul. 23, 2002. Communication Pursuant to Article 96(2) EPC for European Patent Application No. 00 115 577.9.

Oct. 15, 2002. International Search Report prepared by the European Patent Office for PCT/US02/19062.

Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI Internatioanl Semiconductor Manufacturing Science Symposium. pp. 126-132.

Hu, Albert, He Du, Steve Wong, Peter Renteln, and Emanuel Sachs. 1994. "Application of Run by Run Controller to the Chemical-Mechanical Planarization Process." IEEE/CPMT International Electronics Manufacturing Technology Symposium. pp. 371-378.

Smith, Taber, Duane Boning, James Moyne, Arnon Hurwitz, and John Curry. Jun. 1996. "Compensating for CMP Pad Wear Using Run by Run Feedback Control." Proceedings of the Thirteenth International VLSI Multilevel Interconnection Conference. pp. 437-439.

Suzuki, Junichi and Yoshikazu Yamamoto. 1998. "Toward the Interoperable Software Design Models: Quartet of UML, XML, DOM and CORBA." Proceedings IEEE International Software Engineering Standards Symposium. pp. 1-10.

Klein, Bruce. Jun. 1999. "Application Development: XML Makes Object Models More Useful. " Informationweek. pp. 1A-6A.

Chemali, Chadi El, James Moyne, Kareemullah Khan, Rock Nadeau, Paul Smith, John Colt, Jonathan Chapple-Sokol, and Tarun Parikh. Jul./Aug 2000. "Multizone Uniformity Control of a Chemical Mechanical Polishing Process Utilizing a Pre- and Postmeasurement Strategy." J. Vac. Sci. Technol. A, vol. 18(4). pp. 1287-1296. American Vacuum Society.

Jensen, Alan, Peter Renteln, Stephen Jew, Chris Raeder, and Patrick Cheung. Jun. 2001. "Empirical-Based Modeling for Control of CMP Removal Uniformity." Solid State Technology, vol. 44, No. 6, pp. 101-102, 104, 106. Cowan Publ. Corp.: Washington, D.C.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr./May 2002. "Advance Process Control Solutions for Semiconductor Manufacturing." IEEE/SEMI Advanced Semiconductor Manufacturing Conference. pp. 101-106.

Oct. 4, 2002. International Search Report from PCT/US01/22833.

Oct. 23, 2002. International Search Report from PCT/US01/27406.

Nov. 7, 2002. International Search Report from PCT/US02/19061.

Nov. 11, 2002. International Search Report from PCT/US02/19117.

Nov. 12, 2002. International Search Report from PCT/US02/19063.

Miller, G. L., D. A. H. Robinson, and J. D. Wiley. Jul 1976. "Contactless measurement of semiconductor conductivity by radio frequency-free-carrier power absorption." *Rev. Sci. Instrum.*, vol. 47, No. 7. pp. 799-805.

1999. "Contactless Bulk Resistivity/Sheet Resistance Measurement and Mapping Systems." www.Lehighton.com/fabtechl/index.html.

2000. "Microsense II Capacitance Gaging System." www.adetech.com.

El Chemali, Chandi et al., Jul./Aug. 2000. "Multizone uniformity control of a chemical mechanical polishing process utilizing a pre- and postmeasurement strategy." *J. Vac. Sci. Technol.* vol. 18, No. 4. pp. 1287-1296.

Mar. 5, 2001. "KLA-Tencor Introduces First Production-worthy Copper CMP In-situ Film Thickness and End-point Control System." http://www.kla-tencor.com/j/servlet/NewsItem?newsItemID=74.

2002. "Microsense II—5810: Non-Contact Capacitance Gaging Module." www.adetech.com.

Aug. 8, 2003. PCT International Search Report from PCT/US03/08513.

Oct. 14, 2003. PCT International Search Report from PCT/US02/21942.

Oct. 20, 2003. PCT International Search Report from PCT/US02/19116.

Oct. 23, 2003. PCT International Preliminary Examination Report from PCT/US01/24910.

Rocha, Joao and Carlos Ramos. Sep. 12, 1994. "Task Planning for Flexible and Agile Manufacturing Systems." *Intelligent Robots and Systems '94. Advanced Robotic Systems and the Real World, IROS '94 Proceedings of the IEEE/RSJ/GI International Conference on Munich, Germany* Sep. 12-16, 1994. New York, New York: IEEE. pp. 105-112.

Mar. 15, 2002. Office Action for U.S. Appl. No. 09/469,227, filed Dec. 22, 1999.

Mar. 29, 2002. Office Action for U.S. Appl. No. 09/363,966, filed Jul. 29, 1999.

Jun. 20, 2002. Office Action for U.S. Appl. No. 09/619,044, filed Jul. 19, 1999.

Sep. 26, 2002. Office Action for U.S. Appl. No. 09/637,620, filed Aug. 11, 2000.

Oct. 23, 2002. Office Action for U.S. Appl. No. 09/469,227, filed Dec. 22, 1999.

Dec. 17, 2002. Office Action for U.S. Appl. No. 09/363,966, filed Jul. 29, 1999.

Feb. 10, 2003. Office Action for U.S. Appl. No. 09/619,044, filed Jul. 19, 2000.

Apr. 9, 2003. Office Action for U.S. Appl. No. 09/928,474, filed Aug. 14, 2001.

May 8, 2003. Office Action for U.S. Appl. No. 09/637,620, filed Aug. 11, 2000.

Jun. 18, 2003. Office Action for U.S. Appl. No. 09/655,542, filed Sep. 6, 2000.

Aug. 8, 2003. International Search Report for PCT/US03/08513.

Aug. 25, 2003. Office Action for U.S. Appl. No. 10/100,184, filed Mar. 19, 2002.

Sep. 15, 2003. Office Action for U.S. Appl. No. 09/928,474, filed Aug. 14, 2001.

Dec. 1, 2003. Office Action for U.S. Appl. No. 10/173,108, filed Jun. 18, 2002.

Dec. 11, 2003. Office Action for U.S. Appl. No. 09/943,383, filed Aug. 31, 2001.

Dec. 16, 2003. International Search Report for PCT/US03/23964.

Jan. 20, 2004. Office Action for U.S. Appl. No. 09/927,444, filed Aug. 13, 2001.

Jan. 23, 2004. International Search Report for PCT/US02/24860.

Feb. 2, 2004. Office Action for U.S. Appl. No. 09/363,966, filed Jul. 29, 1999.

Feb. 1984, "Method and Apparatus of in Situ Measurement and Overlay Error Analysis for Correcting Step and Repeat Lithographic Cameras," *IBM Technical Disclosure Bulletin*, pp. 4855-4859.

Oct. 1984. "Method to Characterize the Stability of a Step and Repeat Lithographic System." *IBM Technical Disclosure Bulletin*, pp. 2857-2860.

Runyan, W. R., and K. E. Bean. 1990. "Semiconductor Integrated Circuit Processing Technology," p. 48 Reading, Massachusetts: Addison-Wesley Publishing Company.

Zorich, Robert. 1991. *Handbook of Quality Integrated Circuit Manufacturing*. pp. 464-498 San Diego, California: Academic Press, Inc.

Rampalli, Prasad, Arakero Ramesh, and Nimish Shah. 1991. *CEPT—A Computer-Aided Manufacturing Application for Managing Equipment Reliability and Availability in the Semiconductor Industry*, New York, New York: IEEE.

Moyne, James R., Nauman Chaudhry, and Roland Telfeyan. 1995. "Adaptive Extensions to a Multi-Branch Run-to-Run Controller for Plasma Etching." *Journal of Vacumm Science and Technology*. Ann Arbor, Michigan: University of Michigan Display Technology Manufacturing Center.

Moyne, James, Roland Telfeyan, Arnon Hurwitz, and John Taylor. Aug. 1995. "A Process-Independent Run-to-Run Controller and Its Application to Chemical-Mechanical Planarization." *SEMI/IEEE Advanced Semiconductor Manufacturing Conference and Workshop*. Ann Arbor, Michigan: The University of Michigan, Electrical Engineering & Computer Science Center for Display Technology & Manufacturing.

Zhou, Zhen-Hong and Rafael Reif. Aug. 1995. "Epi-Film Thickness Measurements Using Emission Fourier Transform Infrared Spectroscopy—Part II: Real-Time *in Situ* Process Monitoring and Control." IEEE Transcations on Semicondctor Manufacturing, vol. 8, No. 3.

Telfeyan, Roland, James Moyne, Nauman Chaudhry, James Pugmire, Scott Shellman, Duane Boning, William Moyne, Arnon Hurwitz, and John Taylor. Oct. 1995. "A Multi-Level Approach to the Control of a Chemical-Mechanical Planarization Process." Minneapolis, Minnesota: 42$^{nd}$ National Symposium of the American Vacuum Society.

Chang, E., B. Stine, T. Maung, R. Divecha, D. Boning, J. Chung, K. Chang, G. Ray, D. Bradbury, O. S. Nakagawa, S. Oh, and D. Bartelink. Dec. 1995. "Using a Statistical Metrology Framework to Identify Systematic and Random Sources of Die- and Wafer-level ILD Thickness Variation in CMP Processes." Washington, D.C.: International Electron Devices Meeting.

Schmid, Hans Albrecht. 1995. "Creating the Architecture of a Manufacturing Framework by Design Patterns." Austin, Texas: OOPSLA.

Dishon, G., M. Finarov, R. Kipper, J.W. Curry, T. Schraub, D. Trojan, 4$^{th}$ Stambaugh, Y. Li and J. Ben-Jacob. Feb. 1996. "On-Line Integrated Metrology for CMP Processing." Santa Clara, California: VMIC Speciality Conferences, 1$^{st}$ International CMP Planarization Conference.

Smith, Taber, Duanne Boning, James Moyne, Arnon Hurwitz, and John Curry. Jun. 1996. "Compensating for CMP Pad Wear Using Run by Run Feedback Control," Santa Clara, California: VLSI Multilevel Interconnect Conference.

Boning, Duane, William Moyne, Taber Smith, James Moyne, Roland Telfeyan, Arnon Hurwitz, Scott Shellman, and John Taylor. Oct. 1996. "Run by Run Control of Chemical-Mechanical Polishing." *IEEE Trans. CPMT (C)*, vol. 19, No. 4, pp. 307-314.

SEMI. [1986] 1996. "Standard for Definition and Measurement of Equipment Reliability, Availability, and Maintainability (RAM)." SEMI E10-96.

Van Zant, Peter. 1997. *Microchip Fabrication: A Practical Guide to Semiconductor Processing* Third Edition, pp. 472-478. New York, New York: McGraw-Hill.

Campbell, W. Jarrett, and Anthony J. Toprac. Feb. 11-12, 1998. "Run-to-Run Control in Microelectronics Manufacturing." Advanced Micro Devises, TWMCC.

Edgar, Thomas F., Stephanie W. Butler, Jarret Campbell, Carlos Pfeiffer, Chris Bode, Sung Bo Hwang, and K.S. Balakrishnan. May 1998. "Automatic Control in Microelectronics Manufacturing: Practices, Challenges,and Possibilities," Automatica, vol. 36, pp. 1567-1603, 2000.

Moyne, James, and John Curry. Jun. 1998. "A Fully Automated Chemical-Mechanical Planarization Process." Santa Clara, California: VLSI Multilevel Interconnection (V-MIC) Conference.

SEMI. Jul. 1998. *New Standard: Provisional Specification for CIM Framework Domain Architecture*. Mountain View, California; SEMI Standards. SEMI Draft Doc. 2817.

Consilium. Aug. 1998. *Quality Management Component: QMC™ and QMC-Link™ Overview*. Mountain View, California: Consilium, Inc.

U.S. Appl. No. 09/363,966, filed Jul. 29, 1999, Arackaparambil et al., Computer Integrated Manufacturing Techniques.

U.S. Appl. No. 09/469,227, filed Dec. 22, 1999, Somekh et al., Multi-Tool Control System, Method and Medium.

U.S. Appl. No. 09/619,044, filed Jul. 19, 2000, Yuan, System and Method of Exporting or Importing Object Data in a Manufacturing Execution System.

U.S. Appl. No. 09/637,620, filed Aug. 11, 2000, Chi et al., Generic Interface Builder.

U.S. Appl. No. 09/656,031, filed Sep. 6, 2000, Chi et al., Dispatching Component for Associating Manufacturing Facility Service Requestors with Service Providers.

U.S. Appl. No. 09/655,542, filed Sep. 6, 2000, Yuan, System, Method and Medium for Defining Palettes to Transform an Application Program Interface for a Service.

Chemali, Chadi El, James Moyne, Kareemullah Khan, Rock Nadeau, Paul Smith, John Colt, Jonathan Chapple-Sokol, and Tarun Parikh. Nov. 1998. "Multizone Uniformity Control of a CMP Process Utilizing a Pre and Post-Measurement Strategy." Seattle, Washington: SEMETECH Symposium.

Consilium. 1998. *FAB300™*. Moutain View, California: Consilium, Inc.

Khan, Kareemillah, Victor Solakhain, Anthony Ricci, Tier Gu, and James Moyne. 1998. "Run-to-Run Control of ITO Deposition Process." Ann Arbor, Michigan.

Consilium. Jan. 1999. "FAB300™: Consilium's Next Generation MES Solution of Software and Services which Control and Automate Real-Time FAB Operations." www.consilim.com/products/fab300_page.htm#FAB300 Introduction.

Baliga, John. Jul. 1999. "Advanced Process Control: Soon to be a Must." Cahners Semiconductor International. www.semiconductor.net/semiconductor/issues/issues/1999/jul99/docs/feature1.asp.

Consilium. Jul. 1999. "Increasing Overall Equipment Effectiveness (OEE) in Fab Manufacturing by Implementing Consilium's Next-Generation Manufacturing Execution System—MES II." Semiconductor Fabtech Edition 10.

Consilium Corporate Brochure. Oct. 1999. www.consilium.com.

U.S. Appl. No. 09/725,908, filed Nov. 30, 2000, Chi et al., Dynamic Subject Information Generation in Message Services of Distributed Object Systems.

U.S. Appl. No. 09/800,980, filed Mar. 8, 2001, Hawkins et al., Dynamic and Extensible Task Guide.

U.S. Appl. No. 09/811,667, filed Mar. 20, 2001, Yuan et al., Fault Tolerant and Automated Computer Software Workflow.

U.S. Appl. No. 09/927,444, filed Aug. 13, 2001, Ward et al., Dynamic Control of Wafer Processing Paths in Semiconductor Manufacturing Processes.

U.S. Appl. No. 09/928,473, filed Aug. 14, 2001, Koh, Tool Services Layer for Providing Tool Service Functions in Conjunction with Tool Functions.

U.S. Appl. No. 09/928,474, filed Aug. 14, 2001, Krishnamurthy et al ., Experiment Management System, Method and Medium.

Moyne, James. Oct. 1999. "Advancements in CMP Process Automation and Control." Hawaii: (Invited paper and presentation to) Third International Symposium on Chemical Mechanical Polishing IC Device Manufacturing: 196$^{th}$ Meeting of the Electrochemical Society.

Consilium. Nov. 1999. *FAB300™ Update*.

SEMI. 2000. "Provisional Specification for CIM Framework Scheduling Component." San Jose, California. SEMI E105-1000.

Lee, Brian, Duane S. Boning, Winthrop Baylies, Noel Poduje, Pat Hester, Yong Xia, John Valley, Chris Koliopoulus, Dale Hetherington, HongJiang Sun, and Michael Lacy. Apr. 2001. "Wafer Nanotopography Effects on CMP: Experimental Validation of Modeling Methods." San Francisco, California: Materials Research Society Spring Meeting.

Jul. 5, 2001. "Motorola and Advanced Micro Devices Buy ObjectSpace Catalyst Advanced Process Control Product for Five Wafer Fabs." Semiconductor FABTECH. www.semiconductorfabtech.com/industry.news/9907/20.07.shtml.

U.S. Appl. No. 09/943,383, filed Aug. 31, 2001, Shanmugasundram et al., In Situ Based Control Semiconductor Processing Procedure.

U.S. Appl. No. 09/943,955, filed Aug. 31, 2001, Shanmugasundram et al., Feedback Control of a Chemical Mechanical Polishing Device Providing Manipulation of Removal Rate Profiles.

U.S. Appl. No. 09/998,372, filed Nov. 30, 2001, Paik, Control of Chemical Mechanical Polishing Pad Conditioner Directional Velocity to Improve Pad Life.

U.S. Appl. No. 09/998,384, filed Nov. 30, 2001, Paik, Feedforward and Feedback Control for Conditioning of Chemical Mechanical Polishing Pad.

U.S. Appl. No. 10/084,092, filed Feb. 28, 2002, Arackaparambil et al., Computer Integrated Manufacturing Techniques.

U.S. Appl. No. 10/100,184, filed Mar. 19, 2002, Al-Bayati et al., Method, System and Medium for Controlling Semiconductor Wafer Processes Using Critical Dimension Measurements.

Oct. 15, 2001. Search Report prepared by the Austrian Patent Office for Singapore Patent Application No. 200004286-1.

NovaScan 2020. Feb. 2002. "Superior Integrated Process Control for Emerging CMP High-End Applications.".

Johnson, Bob. Jun. 10, 2002. "Advanced Process Control Key to Moore's Law." Gartner, Inc.

Jul. 9, 2002. International Search Report prepared by the European Patent Office for PCT/US01/24910.

Jul. 29, 2002. International Search Report prepared by the European Patent Office for PCT/US01/27407.

Sonderman, Thomas. 2002. "APC as a Competitive Maufacturing Technology: *AMD's Vision for 300MM*." AEC/APC.

U.S. Appl. No. 10/135,405, filed May 1, 2002, Reiss et al., Integration of Fault Detection with Run-to-Run Control.

U.S. Appl. No. 10/135,451, filed May 1, 2002, Shanmugasundram et al., Dynamic Metrology Schemes and Sampling Schemes for Advanced Process Control in Semiconductor Processing.

U.S. Appl. No. 10/173,108, filed Jun. 18, 2002, Shanmugasundram et al., Integrating Tool, Module, and Fab Level Control.

U.S. Appl. No. 10/174,370, filed Jun. 18, 2002, Shanmugasundram et al., Feedback Control Plasma-Enhanced Chemical Vapor Deposition Processes.

U.S. Appl. No. 10/174,377, filed Jun. 2002, Schwarm et al., Feedback Control of Sub-Atmospheric Chemical Vapor Deposition Processes.

IslamRaja, M. M., C. Chang, J. P. McVittie, M. A. Cappelli, and K. C. Saraswat. May/Jun. 1993. "Two Precursor Model for Low-Pressure Chemical Vapor Deposition of Silicon Dioxide from Tetraethylorthosilicate." *J. Vac. Sci. Technol. B*, vol. 11, No. 3, pp. 720-726.

Kim, Eui Jung and William N. Gill. Jul 1994. "Analytical Model for Chemical Vapor Deposition of $SiO_2$ Films Using Tetraethoxysliane and Ozone" (Abstract). *Journal of Crystal Growth*, vol. 140, Issues 3-4, pp. 315-326.

Guo, R.S, A. Chen, C.L. Tseng, I.K. Fong, A. Yang, C.L. Lee, C.H. Wu, S. Lin, S.J. Huang, Y.C. Lee, S.G. Chang, and M.Y. Lee. Jun. 16-17, 1998. "A Real-Time Equipment Monitoring and Fault Detection System." *Semiconductor Manufacturing Technology Workshop*, pp. 111-121.

Sun, S.C. 1998. "CVD and PVD Transition Metal Nitrides as Diffusion Barriers for Cu Metallization." *IEEE*. pp. 243-246.

Lantz, Mikkel. 1999. "Equipment and APC Integration and AMD with Workstream." *IEEE*, pp. 325-327.

Tagami, M., A. Furuya, T. Onodera, and Y. Hayashi. 1999. "Layered Ta-nitrides (LTN) Barrier Film by Power Swing Sputtering (PSS) Technique for MOCVD-Cu Damascence Interconnects." *IEEE*. pp. 635-638.

Yamagishi, H., Z. Tokei, G.P. Beyer, R. Donaton, H. Bender, T. Nogami, and K. Maex. 2000. "TEM/SEM Investigation and Electrical Evaluation of a Bottomless I-PVD TA(N) Barrier in Dual Damascene" (Abstract). *Advanced Metallization Conference 2000*. San Diego, CA.

Eisenbraun, Eric, Oscar van der Straten, Yu Zhu, Katharine Dovidenko, and Alain Kaloyeros. 2001. "Atomic Layer Deposition (ALD) of Tantalum-Based Materials for Zero Thickness Copper Barrier Applications" (Abstract). *IEEE*. pp. 207-209.

Smith, S.R., K.E. Elers, T. Jacobs, V. Blaschke, and K. Pfeifer. 2001. "Physical and Electrical Characterization of ALD Tin Used as a Copper Diffusion Barrier in 0.25 mum, Dual Damascene Backend Structures" (Abstract). *Advanced Metallization Conference 2001*. Montreal, Quebec.

Kim, Y.T. and H. Sim. 2002. "Characteristics of Pulse Plasma Enchanced Atomic Layer Deposition of Tungsten Nitride Diffusion Barrier for Copper Interconnect" (Abstract). *IEIC Technical Report*. vol. 102, No. 178, pp. 115-118.

Elers, Kai-Erik, Ville Saanila, Pekka J. Soininen, Wei-Min Li, Juhana T. Kostamo, Suvi Haukka, Jyrki Juhanoja, and Wim F.A. Besling. 2002. "Diffusion Barrier Deposition on a Copper Surface by Atomic Layer Deposition" (Abstract). *Advanced Materials*. vol. 14, No. 13-14, pp. 149-153.

Peng, C.H., C.H. Hsieh, C.L. Huang, J.C. Lin, M.H. Tsai, M.W. Lin, C.L. Chang, Winston S. Shue, and M.S. Liang. 2002. "A 90nm Generation Copper Dual Damascene Technology with ALD TaN Barrier." *IEEE*. pp. 603-606.

Van der Straten, O., Y. Zhu, E. Eisenbraun, and A. Kaloyeros. 2002. "Thermal and Electrical Barrier Performance Testing of Ultrathin Atomic Layer Deposition Tantalum-Based Materials for Nanoscale Copper Metallization." *IEEE*. pp. 188-190.

Wu, Z.C., Y.C. Lu, C.C. Chiang, M.C. Chen, B.T. Chen, G.J. Wang, Y.T. Chen, J.L. Huang, S.M. Jang, and M.S. Liang. 2002. "Advanced Metal Barrier Free Cu Damascence Interconnects with PECVD Silicon Carbide Barriers for 90/65-nm BEOL Technology." *IEEE*. pp. 595-598.

Jul. 25, 2003. International Search Report for PCT/US02/24858.

Mar. 30, 2004. Written Opinion for PCT/US02/19062.

Apr. 9, 2004, Written Opinion for PCT/US02/19116.

Apr. 22, 2004. Office Action for U.S. Appl. No. 09/998,372, filed Nov. 30, 2001.

Apr. 28, 2004. Written Opinion for PCT/US02/19117.

Apr. 29, 2004. Written Opinion for PCT/US02/19061.

May 5, 2004. Office Action for U.S. Appl. No. 09/943,955, filed Aug. 31, 2001.

May 5, 2004. International Preliminary Examination Report for PCT/US01/27406.
May 28, 2004. Office Action for U.S. Appl. No. 09/943,383, filed Aug. 31, 2001.
Jun. 3, 2004. Office Action for U.S. Appl. No. 09/928,474, filed Aug. 14, 2001.
Jun. 23, 2004. Office Action for U.S. Appl. No. 10/686,589, filed Oct. 17, 2003.
Jun. 30, 2004. Office Action for U.S. Appl. No. 09/800,980, filed Mar. 8, 2001.
Jul. 12, 2004. Office Action for U.S. Appl. No. 10/173,108, filed Jun. 8, 2002.
Jul. 15, 2004. Office Action for U.S. Appl. No. 10/172,977, filed Jun. 18, 2002.
Aug. 2, 2004. Office Action for U.S. Serial No. 10/174,377, filed Jun. 18, 2002.
Aug. 9, 2004. Written Opinion for PCT Serial No. PCT/US02/19063.
Aug. 18, 2004. International Preliminary Examination Report for PCT Serial No. PCT/US02/19116.
Aug. 24, 2004. Office Action for U.S. Appl. No. 10/135,405, filed May 1, 2002.
Aug. 25, 2004. Office Action for U.S. Appl. No. 09/998,384, filed Nov. 30, 2001.
Sep. 9, 2004. Written Opinion for PCT Serial No. PCT/US02/21942.
Sep. 16, 2004. International Preliminary Examination Report for PCT Serial No. PCT/US02/24859.
Sep. 19, 2004. Office Action for U.S. Appl. No. 10/632,107, filed Aug. 1, 2003.
Sep. 29, 2004. Office Action for U.S. Appl. No. 09/363,966, filed Jul. 29, 1999.
Oct. 1, 2004. International Preliminary Examination Report for PCT Serial No. PCT/US03/23964.
Oct. 6, 2004. Office Action for U.S. Appl. No. 10/759,108, filed Jan. 20, 2004.
Oct. 12, 2004. International Preliminary Examination Report for PCT Serial No. PCT/US02/19061.
Nov. 17, 2004. Written Opinion for PCT Serial No. PCT/US01/27407.
Boning, Duane et al., "Run by Run Control of Chemical-Mechanical Polishing." *IEEE Trans.* Oct. 1996. vol. 19, No. 4. pp. 307-314.
Moyne, James et al. "A Run-to-Run Control Framework for VLSI Manufacturing." *Microelectronic Processing '93 Conference Proceedings*. Sep. 1993.
Telfeyan, Roland et al. "Demonstration of a Process-Independent Run-to-Run Controller." *187th Meeting of the Electrochemical Society*. May 1995.
Moyne, James et al. "A Process-Independent Run-to-Run Controller and Its Application to Chemical-Mechanical Planarization." SEMI/IEEE Adv. Semiconductor Manufacturing Conference. Aug. 15, 1995.
Moyne, James et al. "Adaptive Extensions to be a Multi-Branch Run-to-Run Controller for Plasma Etching." *Journal of Vacuum Science and Technology*. 1995.
Sachs, Emanuel et al. "Process Control System for VLSI Fabrication." *IEEE Transaction on Semiconductor Manufacturing*, vol. 4, No. 2. May 1991.
Chaudhry, Nauman A. et al. "A Design Methodology for Databases with Uncertain Data." *University of Michigan*. pp. 1-14. Sep. 1994.
Chaudhry, Nauman et al. "Designing Databases with Fuzzy Data and Rules for Application to Discrete Control." *University of Michigan*. pp. 1-21. Nov. 1994.

Khan, Kareemullah et al. "Run-to-Run Control of ITO Deposition Process." *University of Michigan*. pp. 1-6. 1998.
Chaudhry, Nauman et al. "Active Controller: Utilizing Active Databases for Implementing Multi-Step Control of Semiconductor Manufacturing." *IEEE Transactions on Components, and Manufacturing Technology-Part C*, vol. 21, No. 3, pp. 1-24. Jul. 1998.
Moyne, James et al. "Yield Improvement at the Contact Process Through Run-to-Run Control." *IEEE/CPMT Int'l Electronics Manufacturing Technology Symposium*. Oct. 1999.
Kim, Jiyoun et al. "Gradient and Radial Uniformity Control of a CMP Process Utilizing a Pre- and Post-Measurement Strategy." *University of Michigan*. Mar. 2000.
Sep. 1992. "VLSI Metals Management Evaluation System For Additive And Subtractive Metal Technologies." IBM Technical Disclosure Bulletin, vol. 35, No. 4A, pp. 56-61.
Mar. 1992. "Multi-Line Listbox Control For Compound Entries." IBM Technical Disclosure Bulletin, vol. 34, No. 10A, pp. 113-114.
Dec. 1993. "Method For Rapid Performance Analysis and Design of Semiconductor Manufacturing Facilities." IBM Technical Disclosure Bulletin, vol. 36, No. 12, pp. 423-424.
Feb. 1984. "Substrate Screening Process." *IBM Technical Disclosure Bulletin*, pp. 4824-4825.
Herrmann, D. 1988. "Temperature Errors and Ways of Elimination for Contactless Measurement of Shaft Vibrations (Abstract)." *Technisches Messen™*, vol. 55, No. 1, pp. 27-30. West Germany.
Lin, Kuang-Kuo and Costas J. Spanos. Nov. 1990. "Statistical Equipment Modeling for VLSI Manufacturing: An Application for LPCVD." *IEEE Transactions on Semiconductor Manufacturing*, v. 3, n. 4, pp. 216-229.
Chang, Norman H. and Costas J. Spanos. Feb. 1991. "Continuous Equipment Diagnosis Using Evidence Integration: An LPCVD Application." *IEEE Transactions on Semiconductor Manufacturing*, v. 4, n. 1, pp. 43-51.
Burke, Peter A. Jun. 1991. "Semi-Empirical Modelling of SiO2 Chemical-Mechanical Polishing Planarization," *VMIC Conference, 1991 IEEE*, pp. 379-384. IEEE.
May 1992. "Laser Ablation Endpoint Detector." *IBM Technical Disclosure Bulletin*, pp. 333-334.
Spanos, Costas J., Hai-Fang Guo, Alan Miller, and Joanne Levine-Parrill. Nov. 1992. "Real-Time Statistical Process control Using Tool Data." *IEEE Transactions on Semiconductor Manufacturing*, v. 5, n. 4, pp. 308-318.
Feb. 1993. "Electroless Plating Scheme to Hermetically Seal Copper Features." *IBM Technical Disclosure Bulletin*, pp. 405-406.
Scarr, J.M. and J. K. Zelisse. Apr. 1993. "New Topology for Thickness Monitoring Eddy Current Sensors (Abstract)." *Proceedings of the 36th Annual Technical Conference*, Dallas, Texas.
Matsuyama, Akira and Jessi Niou. 1993. "A State-of-the-Art Automation System of an ASIC Wafer Fab in Japan." *IEEE/SEMI International Semiconductor Manufacturing Science Syposium*, pp. 42-47.
Yeh, C. Eugene, John C. Cheng, and Kwan Wong. 1993. "Implementation Challenges of a Feeback control System for Wafer Fabrication." *IEEE/CHMT International Electronics Manufacturing Technology Symposium*, pp. 438-442.
Kurtzberg, Jerome M. and Menachern Levanoni. Jan. 1994. "ABC: A Better Control for Manufacturing." *IBM Journal of Research and Development*, v. 38, n. 1, pp. 11-30.

Mozumder, Purnendu K. and Gabriel G. Barna. Feb. 1994, "Statistical Feedback Control of a Plasma Etch Process," *IEEE Transactions on Semiconductor Manufacturing*, v. 7, n. 1, pp. 1-11.

Muller-Heinzerling, Thomas, Ulrich Neu, Hans Georg Nurnberg, and Wolfgang May. Mar. 1994. "Recipe-Controlled Operation of Batch Processes with Batch X." *ATP Automatisierungstechnische Praxis*, vol. 36, No. 3, pp. 43-51.

Hu, Alert, He Du, Steve Wong, Peter Renteln, and Emmanuel Sachs. 1994. "Application of Run by Run Controller to the Chemical-Mechanical Planarization Process." *IEEE/CPMT International Electronics Manufacturing Technology Symposium*, pp. 371-378.

Leang, Sovarong, Shang-Yi Ma, John Thomson, Bart John Bombay, and Costas J. Spanos. May 1996. "A Control System for Photolithographic Sequences." *IEEE Transactions on Semiconductor Manufacturing*, vol. 9, No. 2.

Boning, Duane S., William P. Moyne, Taber H. Smith, James Moyne, Ronald Telfeyan, Arnon Hurwitz, Scott Shellman, and John Taylor. Oct. 1996. "Run by Run Control of Chemical -Mechanical Polishing." *IEEE Transactions on Components, Packaging, and Manufacturing Technology—Part C*, vol. 19, No. 4, pp. 307-314.

Zhe, Ning, J. R. Moyne, T. Smith, D. Boning, E. Del Castillo, Yeh Jinn-Yi, and Hurwitz. Nov. 1996. "A Comparative Analysis of Run-to-Run Control Algorithms in Semiconductor Manufacturing Industry (Abstract)." *IEEE/SEMI 1996 Advanced Semiconductor Manufacturing Conference Workshop*, pp. 375-381.

Yasuda, M., T. Osaka, and M. Ikeda. Dec. 1996. "Feedforward Control of a Vibration Isolation System for Disturbance Suppression (Abstract)." *Proceedings of the 35th IEEE Conference on Decision and Control*, vol. 2, pp. 1229-1233. Kobe, Japan.

Fan, Jr-Min, Ruey-Shan Guo, Shi-Chung Chang, and Kian-Huel Lee. 1996. "Abnormal Tred Detection of Sequence-Disordered Data Using EWMA Method." *IEEE/SEMI Advanced Semiconductor Manufacturing Conference*, pp. 169-174.

Smith, Taber and Duane Boning, 1996. "A Self-Tuning EWMA Controller Utilizing Artificial Neural Network Function Approximation Techniques." *IEEE/CPMT International Electronics Manufacturing Technology Symposium*, pp. 355-363.

Guo, Ruey-Shan, Li-Shia Huang, Argon Chen, and Jin-Jung Chen. Oct. 1997. "A Cost-Effective Methodology for a Run-by-Run EWMA Controller." *International Symposium on Semiconductor Manufacturing*, pp. 61-64.

Mullins, J. A., W. J. Campbell, and A. D. Stock. Oct. 1997. "An Evaluation of Model Predictive Control in Run-to-Run Processing in Semiconductor Manufacturing (Abstract)," *Proceedings of the SPIE—The International Society for Optical Engineering Conference*, vol. 3213, pp. 182-189.

Reitman, E. A., D. J. Friedman, and E. R. Lory. Nov. 1997, "Pre-Production Results Demonstrating Multiple-System Models for Yield Analysis (Abstract)," *IEEE Transactions on Semiconductor Manufacturing*, vol. 10, No. 4, pp. 469-481.

Durham, Jim and Myriam Roussel. 1997. "A Statistical Method for Correlating In-Line Defectivity to Probe Yield." *IEEE/SEMI Advanced Semiconductor Manufacturing Conference*, pp. 76-77.

Shindo, Wataru, Eric H. Wang, Rarn Akella, and Andrzej J. Strojovas. 1997. "Excursion Detection and Source Isolation in Defect Inspection and Classification." *2nd International Workshop on Statistical Metrology*, pp. 90-93.

Fang, S. J., A. Barda, T. Jarnecko, W. Little, D. Outley, G. Hempel, S. Joshi, B. Morrison, G. B. Shinn, and M. Birang, 1998. "Control of Dielectric Chemical Mechanical Polishing (CMP) Using and Interferometry Based Endpoint Sensor." *International Proceedings of the IEEE Interconnect Technology Conference*, pp. 76-78.

Ouma, Dennis, Duane Boning, James Chung, Greg Shinn, Leif Olsen, and John Clark. 1998. "An Integrated Characterization and Modeling Methodology for CMP Dielectric Planarization." *Proceedings of the IEEE 1998 International Interconnect Technology Conference*, pp. 67-69.

Boning, Duane S. Jerry Stefani, and Stephanie W. Butler. Feb. 1999. "Statistical Methods for Semiconductor Manufacturing." *Encyclopedia of Electrical Engineering, J. G. Webster, Ed.*.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164-166.

Ruegsegger, Steven, Aaron Wagner, James S. Freudenberg, and Dennis S. Grimard. Nov. 1999. "Feedforward Control for Reduced Run-to-Run Variation in Microelectronics Manufacturing." *IEEE Transactions on Semiconductor Manufacturing*vol. 12, No. 4.

Nov. 1999. "How to Use EWMA, to Achieve SPC and EPC Control," *International Symposium on NDT Contribution to the Infrastructure Safety Systems*, Tores, Brazil. <http://www.ndt.net/abstract/ndtiss99/data/35.htm>.

Edgar, T. F., W. J. Campbell, and C. Bode. Dec. 1999. "Model-Based Control in Microelectronics Manufacturing." *Proceedings of the 38thIEEE Coference on Decision and Control*, Phoenix, Arizona, vol. 4, pp. 4185-4191.

Choung, Robin. Oct. 18, 2000. "Copper Interconnect Technology." *AVS/CMp User Group Meeting*, Santa Clara, CA.

Edgar, Thomas F., Stephanie W. Butler, W. Jarrett Campbell. Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." *Automatica*, v. 36, n. 11.

Khan, S., M. Musavi, and H. Ressom. Nov. 2000. "Critical Dimension control in Semiconductor Manufacturing (Abstract)." *ANNIE 2000. Smart Engineering Systems Design Conference*, pp. 995-1000. St. Louis, Missouri.

ACM Research Inc. 2000. "Advanced Copper Metallization for 0.13 to 0.05 µm & Beyond." <http://acmrc.com/press/ACM-ECP-brochure.pdf>.

Ravid, Avi, Avner Sharon, Amit Weingarten, Vladimir Machavariani, and David Schemer. 2000. "Copper CMP Planarity Control Using ITM." *IEEE/SEMI Advanced Semiconductor Manufacturing Conference*, pp. 437-443.

Chen, Argon and Rucy-Shan Guo. Feb. 2001. "Age-Based Double EWMA Controller and Its Application to CMP Processes." *IEEE Transactions on Semiconductor Manufacturing*, vol. 14, No. 1, pp. 11-19.

Tan, K. K., H. F. Dou, and K. Z. Tang. May-Jun. 2001. "Precision Motion Control System for Ultra-Precision Semiconductor and Electronic Components Manufacturing (Abstract)." *51" Electronic Components and Technology Conference 2001. Proceedings*, pp. 1372-1379. Orlando, Florida Heuberger, U. Sep. 2001. "Coating Thickness Measurement with Dual-Function Eddy-Current & Magnetic Inductance Instrument (Abstract)." *Galvanotechnik*, vol. 92, No. 9, pp. 2354-2366+IV.

Wang, LiRen and Hafin Rowlands. 2001. "A Novel NN-Fuzzy-SPC Feedback Control System." *8th IEEE International Conference on Emerging Technologies and Factory Automation*, pp. 417-423.

Moyne, J., V. Solnkhian, A. Yershov, M. Anderson, and D. Mockler-Hebert. Apr.-May 2002. "Development and Deployment of a Multi-Component Advanced Process Control System for an Epitaxy Tool (Abstract)." *2002 IEEE Advanced Semiconductor Manufacturing Conference and Workshop*, pp. 125-130.

Sarfary, M., A. Shanmugasundram, A. Schwarm, J. Paik, Jimin Zhang, Rong Pan, M. J. Seamons, h. Li, R. Hung, and S. Parikh. Apr.-May 2002. "Advance Process Control Solutions for Semiconductor Manufacturing (Abstract)." *13th Annual IEEE/SEMI Advanced Semiconductor Manufacturing Conference. Advancing the Science and Technology of Semiconductor Manufacturing. ASMC 2002*, pp. 101-106. Boston, MA.

Campbell, W. J., S. K. Firth, A. J. Toprac, and T. F. Edgar. May 2002. "A Comparison of Run-to-Run Control Algorithms (Abstract)." *Proceedings of 2002 American Control Conference*, vol. 3, pp. 2150-2155.

Good, Richard and S. Joe Qin. May 2002. "Stability Analysis of Double EWMA Run-to-Run Control with Metrology Delay," *IEEE/CPMT International Electronics Manufacturing Technology Symposium*, pp. 355-363.

Smith, Stewart, Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." *IEEE Transactions on Semiconductor Manufacturing*, vol. 15, No. 2, pp. 214-222.

Itabashi. Takeyuki, Hiroshi Nakano, and Haruo Akahoshi. Jun. 2002. "Electroless Deposited CoWB for Copper Diffusion Barrier Metal." *Ieee International Interconnect Technology Conference*, pp. 285-287.

ACM Research, Inc. 2002. "ACM Ultra ECP® System: Electro-Copper Plating (ECP) Deposition." www.acmrc.com/ecp.html.

KLA-Tencor Corporation. 2002. "KLA Tencor: Press Release: KLA-Tencor Introduces First Production-Worthy Copper CMP In-Situ Film Thickness and End-point Control System: Multi-Million Dollar Order Shipped to Major CMP Tool Manufacturer." www.kla-tencor.com/news_events/press_releases/press_releases2001/984086002.html.

Takahashi, Shingo, Kaori Tai, Hiizu Ohtorii, Naoki Komai, yuji Segawa, Hiroshi Horikoshi, Zenya Yasuda, Hiroshi Yamada, Masao Ishihara, and Takeshi Nogami. 2002. "Fragile Porous Low-k/Copper Integration by Using Electro-Chemical Polishing." *2002 Symposium on VLSI Technology Digest of Technical Papers*, pp. 32-33.

Cunningham, James A. 2003. "Using Electrochemistry to Improve Copper Interconnects." <http://www.e-insite.net/semiconductor/index.asp?layout=article&articleid=CA47465>.

Mar. 25, 2003. International Search Report for PCT/US02/24859 prepared by the European Patent Office.

Adams, Bret W., Bogdan Swedek, Rajeev Bajaj, Fritz Redeker, Manush Birang, and Gregory Amico. "Full-Wafer Endpoint Detection Improves Process Control in Copper CMP." *Semiconductor Fabtech* —12th edition. Applied Materials, Inc., Santa Clara, CA.

Berman, Mike, Thomas Biddy, and Alan Smith. "Review of In Situ & In-line Detection for CMP Applications." *Semiconductor Fabtech*, 8th Edition, pp. 267-274.

"Semiconductor Manufacturing: An Overview." <http://users.ece.gatech.edu/-grnay/overview.html>.

US 6,150,664, 11/2000, Su (withdrawn)

* cited by examiner

METHOD, SYSTEM AND MEDIUM FOR PROCESS CONTROL FOR THE MATCHING OF TOOLS, CHAMBERS AND/OR OTHER SEMICONDUCTOR-RELATED ENTITIES

CROSS REFERENCES TO RELATED APPLICATIONS

This application claims the benefit of U.S. Provisional Application Ser. No. 60/365,782 filed Mar. 21, 2002, expressly incorporated herein by reference; and U.S. Provisional Application Ser. No. 60/298,878 filed Jun. 19, 2001, expressly incorporated herein by reference.

BACKGROUND OF THE INVENTION

1. Field of the Invention

The present invention concerns computer-implemented and/or computer assisted methods, systems and mediums for enabling improved control (e.g., parallel control) during advanced process control. More specifically, one or more embodiments of the present invention relate to enhanced control of the processing of products, such as semi-conductor wafers, on comparably configured processing devices, such as chambers, utilizing behavior information.

2. Related Art

Microelectronic products, such as semi-conductor chips, are fabricated in foundries. In a foundry, batches of products are typically fabricated in parallel on assembly lines using identically configured components such as, e.g., chambers, tools, and modules (e.g., a grouping of tools). The intention is that these assembly lines will produce batches of identical products. Typically, each of these products are made by utilizing a multitude of recipes, where each recipe may be thought of as a set of predefined process parameters required to effectuate a processing outcome.

It is also often the case that a batch of products, such as a small lot of specialized chips, are produced, and then the next batch of the same type of product is produced minutes, hours, days, weeks or even months later. This later parallel batch could be produced on the same or different assembly line. Despite the time lapse, it is intended that the products in these batches will be identical.

Though it may be desired that, in the situations mentioned above, the results of a particular recipe (and, where the sum total of the recipes are the same, the final products themselves) be identical from batch to batch, this in fact might not necessarily occur. One reason is because differences in the raw materials that are used from one batch of wafers to another may emerge. For example, one shipment of a raw material may contain chemical impurities that do not exist in a subsequent shipment.

Another reason for lack of identical results concerns those situations where the manufacture of two different products happens to involve the use of at least one recipe in common (but where, e.g., the recipes used prior to the common recipe for each product differs). Though two different end products may be the ultimate goal, it is still desirable for the specific common recipe to have the same specific result when used in the course of manufacturing each of the two products. However, in reality, the effect of the common recipes may differ somewhat, due to the fact that the processing tools had, prior to the common recipe steps, been performing different tasks in the course of manufacturing each of the two products. E.g., prior to implementing the common recipe, a tool manufacturing product X may have been tasked to provide a relatively deep etch, whereas a tool manufacturing product Y may have been tasked to provide a relatively shallow etch prior to implementing the common recipe. Thus, the ability of a processing tool to reset itself to perform a specific task may be affected by the type of task it had previously been performing.

When situations such as those mentioned above occur and cause the tools to produce results not otherwise desired by the recipes, techniques exist to allow appropriate modifications to be made to the tool settings. However, if one were to contemplate conveying those modification settings to, e.g., other tools on another assembly line making the same product, a problem one would encounter is that each component of an assembly line, e.g., chambers, tools and modules, is adjusted separately and independently, even though the same product is being fabricated in parallel on another assembly line. While modifications made to one tool or chamber on, e.g., one assembly line could be manually matched in another tool or chamber on, e.g., another assembly line (or re-used on the same assembly line at a later time), no method or process currently exists to provide for automated communication of the modification. These types of communication problems also exist with regard to components on the same assembly line, as well as sub-components on the same component (and even regarding use of the same component or sub-component at different times).

Consequently, what is needed is an improved scheme for capturing desired behaviors (e.g., parameter settings) of components, and communicating those behaviors to other (and/or later used) components to, e.g., improve consistency of the results of given recipes (or other instruction-based entities).

SUMMARY OF THE INVENTION

The present invention addresses the deficiencies of the conventional technology described above by, e.g., capturing behaviors of one or more assembly line components, and communicating those behaviors to appropriate components of, e.g., other assembly lines within a foundry to, e.g., improve the consistency of the results of a given recipe(s) from use to use. Thus, aspects of the present invention provide for a better form of control among comparably configured processing devices handling parallel workstreams. Accordingly, one or more embodiments of the present invention provide for sharing and/or reuse of behavior information for better control of, e.g., foundry components, even when parallel processing is spaced apart time wise.

It is envisioned (by one or more embodiments of the present invention) that the present invention can be used in the production of a micro-electronic device using a series of "parallel" assembly lines, where each assembly line includes one or more entities being and/or containing one or more components (e.g., chambers, tools and/or modules) that are configured identically to components of at least one other assembly line. In operation, for example, the component behaviors and the model and/or recipe parameters for converging the results of processing are collected as a first batch is processed by one of a number of components in an assembly line to produce at least one type of micro-electronic device. The information relating to the collected behavior is then shared among identically configured components in another assembly line to produce a second batch of that type of micro-electronic device(s). In one or more embodiments of the present invention, the aforementioned second batch may also be produced later in time (using the behaviors and model parameters collected during production of the first batch) by one or more components of the same assembly line (or same stand-alone component) as produced the first batch. The present invention also provides, according to one or more embodiments, for extrapolating model parameters for a portion of the assembly line, such as one of the processing devices, to a product (whether same, similar or different) with a similar initial model for that part of the assembly line.

In accordance with one or more embodiments of the present invention, there are provided methods, systems and computer programs for converging, to a target setting, results generated by one or more semi-conductor processing entities including (or itself acting as the) at least one comparably configured component. The present invention includes collecting data representative of one or more behaviors of at least one of the one or more processing entities, said one or more behaviors being collected in the course of the results of the one or more processing entities converging to (or attempting to maintain proximity with) the target setting. The present invention also includes sharing information relating to the data representative of the one or more behaviors with the one or more processing entities from which the data was collected, wherein the sharing of the information facilitates the one or more processing entities receiving the data to converge to (or to attempt to maintain proximity with) the target setting.

In accordance with one or more embodiments of the present invention, the sharing of the information is performed on a wafer-to-wafer basis, and/or performed on a run-to-run basis.

Collecting data may optionally include measuring the at least one device on a metrology tool. Converging may optionally include adjusting a process parameter for at least one of the comparably configured components subsequent to measuring of the at least one device and prior to processing of a next device.

According to one or more embodiments of the present invention, collecting data includes measuring the at least one device in a batch of devices on a metrology tool, and sharing includes adjusting a process parameter for at least one of the comparably configured components subsequent to measuring of the batch and prior to processing of a next batch.

According to one or more embodiments of the present invention, the comparably configured components are on a same semi-conductor processing entity; and/or the comparably configured components are on at least two semi-conductor processing entities.

Optionally, the adjustment is performed on a same processing entity at substantially different processing times. Optionally, the adjustment is performed on a different processing entity, at a substantially different processing time and/or a substantially same processing time.

Optionally, sharing includes modifying a recipe for at least one of the comparably configured components subsequent to measuring of the batch and prior to processing of a next batch.

Optionally, the semi-conductor processing entity includes an integrated metrology tool, and/or a separate metrology tool is provided for the semi-conductor processing entity.

According to one or more embodiments of the present invention, the at least one semiconductor processing entity may be controlled from a controller.

BRIEF DESCRIPTION OF THE DRAWINGS

The above mentioned and other advantages and features of the present invention will become more readily apparent from the following detailed description and the accompanying drawings, in which.

DETAILED DESCRIPTION OF THE PREFERRED EMBODIMENTS

The following detailed description includes many specific details. The inclusion of such details is for the purpose of illustration only and should not be understood to limit the invention. Throughout this discussion, similar elements are referred to by similar numbers in the various figures for ease of reference. In addition, features in one embodiment may be combined with features in other embodiments of the invention.

A process control system, such as a semi-conductor fabrication plant, may include process tools each perhaps with multiple chambers, wherein each of the chambers is intended to work in parallel on a stream of products, to produce essentially identical products or products where at least some of the processing is essentially identical. One or more embodiments of the present invention concern matching (e.g., imparting the behavior information of one component to another component) between one or more comparably configured components (e.g., chambers on one or more process tools) where products are processed in parallel. One or more embodiments of the present invention also provides for matching where the products are processed at different times, perhaps on the same or different process tool(s). The designation "parallel" is used to indicate that two (or more) streams of products are being subjected to at least some comparable processing (e.g., parallel assembly lines), whether at more or less the same time or at different times.

Figure 1:
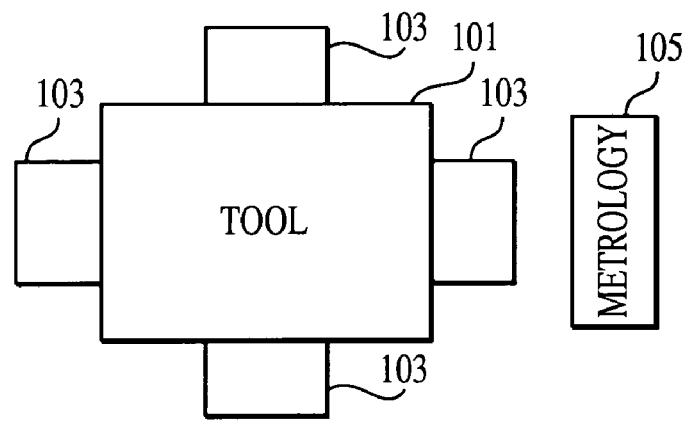
FIG. 1 is a block diagram illustrating an example process tool without advanced process control, with stand-alone metrology.
Figure 2:
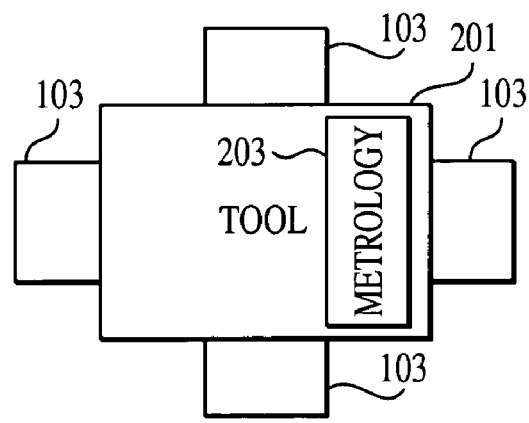
FIG. 2 is a block diagram of an example process tool without advanced process control, with integrated metrology.

FIGS. 1 and 2 are block diagrams illustrating process tools 101, 201. Each has multiple chambers 103, each of which may process one or more wafers. The process tool 101 in FIG. 1 has a separate, stand alone metrology tool 105.

A batch of wafers processed by the process tool 101 is measured by the metrology tool 105 for specification compliance after processing of the batch is completed. On the other hand, the process tool 201 of FIG. 2 incorporates a metrology tool 203; wafers may be measured by the incorporated metrology tool 203 as they are processed in the process tool 201 without necessarily awaiting completion of processing on the batch.

With some process control to control and/or coordinate the configuration of the chambers 103, matching of the desired configurations and/or output of the chambers 103 becomes possible. The closer that the process control is integrated into the processing, the faster the chambers 103 can be matched. The ability to control the configuration of chambers 103, regardless of the tool 101, 201 on which they are located, renders the tool 101, 201 essentially invisible to the process of chamber matching.

Figure 3:
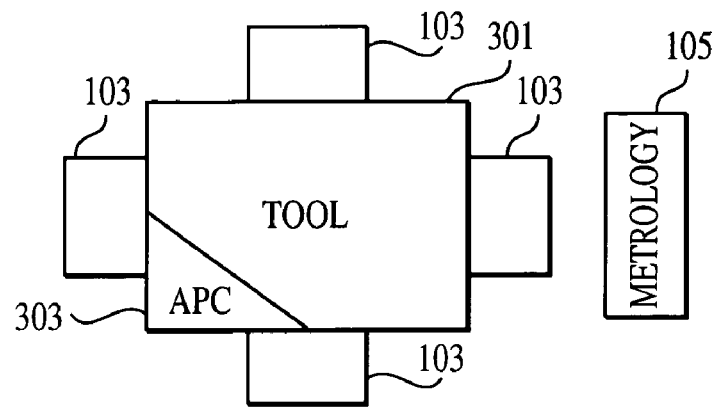
FIG. 3 is a block diagram of an example process tool with advanced process control, using stand-alone metrology.
Figure 4:
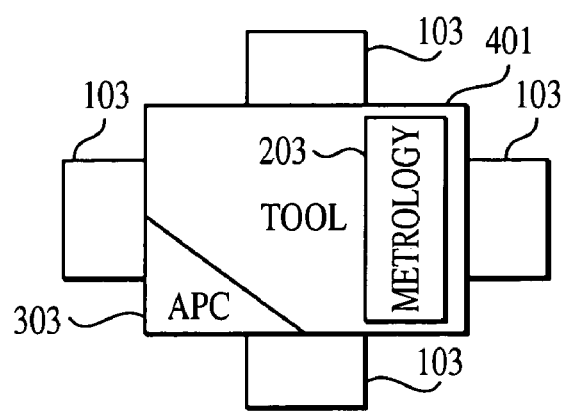
FIG. 4 is a block diagram of an example process tool with advanced process control, having integrated metrology.

FIGS. 3 and 4 illustrate process tools 301, 401 with advanced process control (APC) 303 (or some portion thereof) integrated therein. Chamber matching can be done on the process tool 301 in FIG. 3 on a run-to-run basis, since the metrology tool 105 is separate. However, for the process tool 401 with integrated metrology tool 203, matching may be done on a wafer-to-wafer basis because each wafer may be measured after processing (if desired) and the result of the measurement may be used to adjust the recipe and/or model parameters for subsequent wafers.

Figure 5:
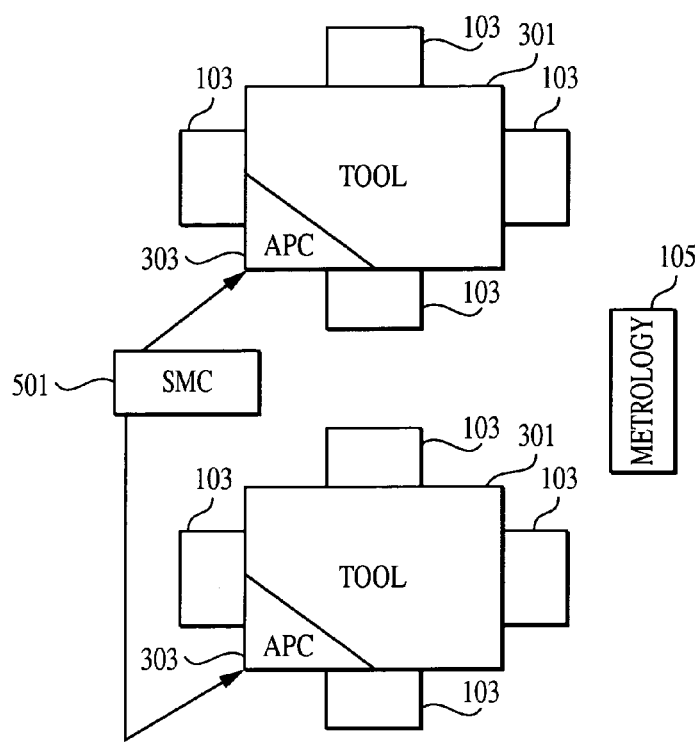
FIG. 5 is a block diagram of processing devices used for one or more embodiments of the present invention used in connection with chamber and tool matching on a run-to-run basis.
Figure 6:
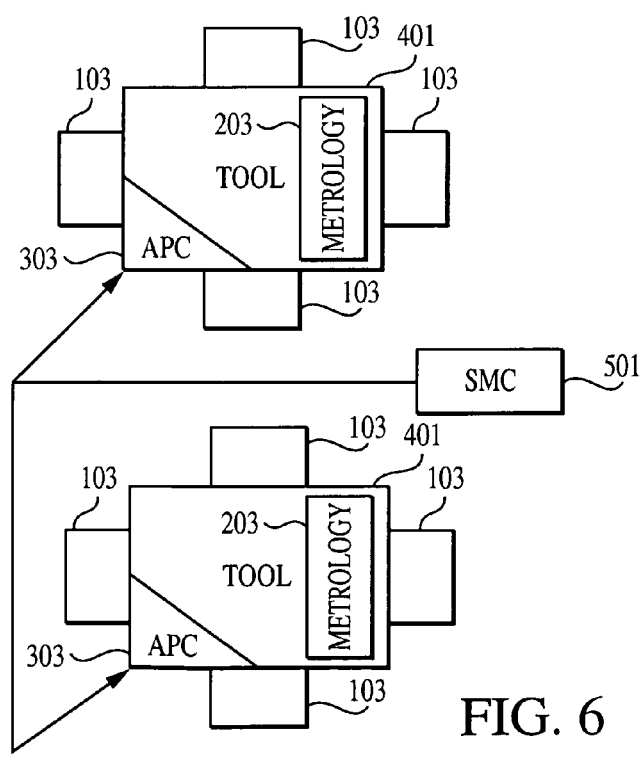
FIG. 6 is a block diagram of processing devices used for one or more embodiments of the present invention in connection with chamber and tool matching on wafer-to-wafer basis.

Reference is made to FIGS. 5 and 6. Alternatively, the system can match one or more comparably configured chambers on different tools; or some combination thereof. Consider an example of two copies of the same tool, 301, 401 each having one or more particular chemical vapor deposition (CVD) chambers 103 running a particular CVD process. The present invention according to one or more embodiments will match the performance of one or more of those chambers, even though they may be on different tools. The chambers are configured in a comparable way, so that in respect to their portion of processing on the intended product, each is intended to produce an "identical" (considering tolerances) result. The chambers are "identical" in that they are supposed to perform the same processing, optionally, in a physically different tool. In essence, there are multiple copies of the same tool and/or chamber working in parallel on different batches of chips.

The match could be at the chamber level or it could be at the tool level. That is, it could be matching just a chamber, it could be matching any two or more chambers on the same tool or any two or more chambers on different tools or the same chamber on the same tool at a later time, providing they are the same kind of chamber running the same kind of process. Also, one can match the whole tool performance to two (or more) separate tools of the same type, provided they are identical copies.

Reference is made to FIG. 5, one example of where chamber matching may be done on a batch basis. The system will process a batch of wafers in one of the chambers 103 on the process tool 301, and take them out of the process tool 301 to a stand alone metrology tool 105, measure them, and enter the measurement results into the APC 303 software. The APC 303 software will determine any adjustments to be made, provide a modified recipe for the next batch of wafers, and then input that recipe into the process tool for the next batch of wafers.

Reference is made to FIG. 6, which shows one example where chamber matching may be done on a run-to-run basis. In order to make adjustments wafer-to-wafer within a batch, there should be provided a way to measure and/or adjust wafer-to-wafer. In this example, this includes an integrated metrology tool 203 and the APC 303 (or a portion thereof) running on the process tool 401.

The APC 303 provides a program (or communication with a program running on a controller) that is controlling the process on the chambers 103 and/or process tools 401 to be matched. It includes a process that makes recipe adjustments, preferably automatically, and changes set points on the process tool 401. Preferably, these set points are provided in a table and are based on a simulated outcome from a previous process. They may be predetermined, based on simulations, actual results and/or calculations (as discussed further below).

FIGS. 5 and 6 also reference a Separate Module Controller (SMC) 501. The SMC is implemented, according to one or more embodiments, as hardware and/or software, for enabling connection to and communication of adjustments for matching regarding tools, process modeling and/or process control. The SMC may, for example, be a computer with communications capability. It links two or more process tools, and it provides the communication between the various process tools that are connected to it. Also, the SMC may, for example, be configured so as to communicate with the individual process tools via a remote module controller, or the module controller can be integrated into each tool. The module controller may also include dial in capabilities or may otherwise communicate in any appropriate method with a common server, in order to access the controller software.

Figure 7:
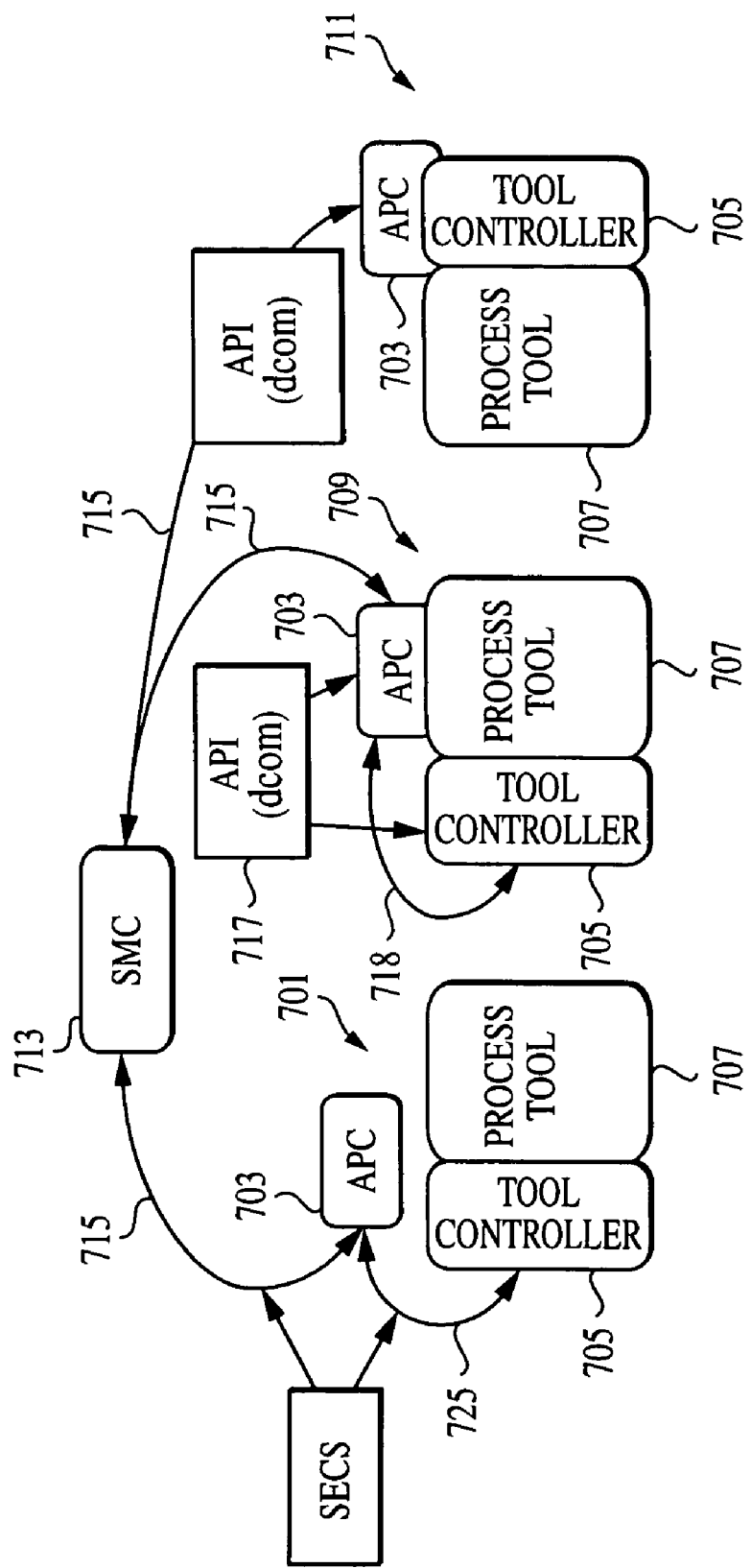
FIG. 7 is a block diagram illustrating one or more alternative and/or overlapping embodiments of the present invention used in connection with various process tools.

Reference is made to FIG. 7, showing various alternative (and/or overlapping) implementations of a system that may be used in connection with one or more embodiments of the present invention. In the first implementation 701, the APC is executed on a separate CPU running the APC 703; it is not embedded in the tool controller 705 or process tool 707. An appropiate communications interface, such as for example the standard Semiconductor Equipment Communication Standard (SECS) 725 communication protocol, interfaces between the APC 703 and the tool controller 705. The APC 703 provides the program (or communication with the program running on a controller) that controls the process(es) on the chambers and/or tools 707 to be matched.

The SMC software that performs the actual process control computation, according to these implementations, is on a stand alone computer 713. The SMC computer 713 is linked, for example such as through a local area network (LAN) or through hardwiring 715 to the process tool 707 and the SMC computer 713 communicates with the tool controller 705 included on the process tool 707. (Process tools conventionally include some type of a tool controller.)

Whether or not the process tool 707 is executing under the APC, the tool controller 705 conventionally provides the ability to run the recipes on the process tool. In the first implementation 701, the APC 703 is a separate device, physically separated from the process tool 707 and communicating therewith.

In the second implementation 709, the APC 703 is embedded into the process tool 707. The APC 703 is packaged on the tool, and it communicates on an interface 718 with the tool controller 705 through an application programming interface (API), such as for example a conventional dcom API interface protocol. In the second implementation 709 the API is included in the APC 703, and the APC 703 is located physically on the process tool 707.

The third implementation 711 may be considered to be an extension of an idea embodied in the second implementation 709. Here, the separate APC 703 is not provided as a physically separate stand alone hard drive. According to this implementation the APC software advantageously runs on the same hard drive on which the tool controller 705 runs, so that the APC 703 is physically embedded in both the process tool 707 and the tool controller 705. This presents a more unitary implementation for use in connection with one or more embodiments of the invention.

Figure 8:
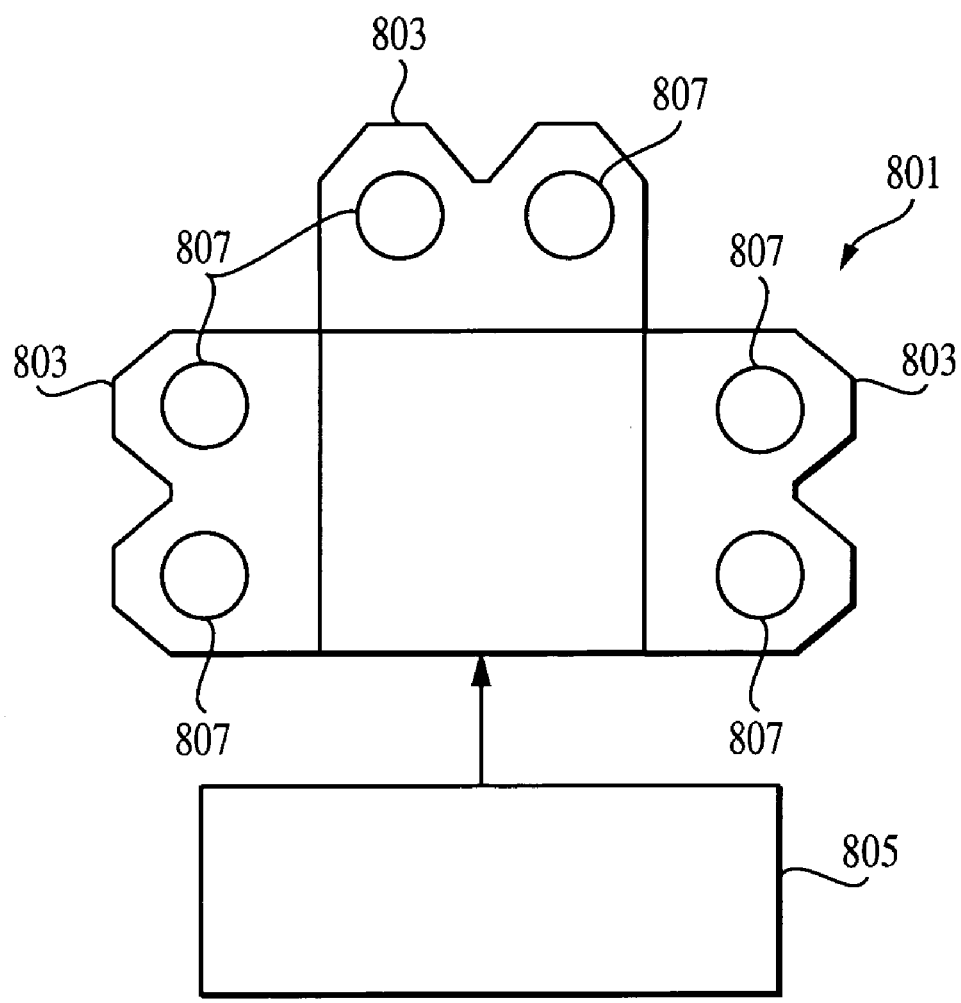
FIG. 8 is a plan view block diagram showing an example of a tool cluster with chambers, for use in connection with the one or more embodiments of the present invention.

Reference is made to FIG. 8, a block diagram of an example process tool 801. In this example, there are provided three chambers 803 that are on the top and the left and right side (in the plan view). Each chamber 803 includes two processing stations 807 where the wafers sit, so each chamber can process two wafers at a time, on this particular tool. Not all process tools are configured in this manner. The principles discussed here nevertheless apply to other types of process tools. The two stations 807 are referred to as "left" and "right" twins. This particular process tool 801 can be configured with three identical chambers, all depositing the same film, or configured with different chambers, each running a different type of film. The control concepts according to one or more embodiments of the present invention are used to match two or more products produced by two or more selected chambers 803, and/or left and right twins to each other. A wafer is loaded into a chamber 803 by a loadlock 805. A number of such process tools can be used in an assembly line. There might be a bank of perhaps five process tools 801 in a row, all running a particular step. These would further be incorporated into several assembly lines. A specific example of a process tool 801 is the Producer (™) from Applied Materials of Santa Clara, Calif.

Figure 9:
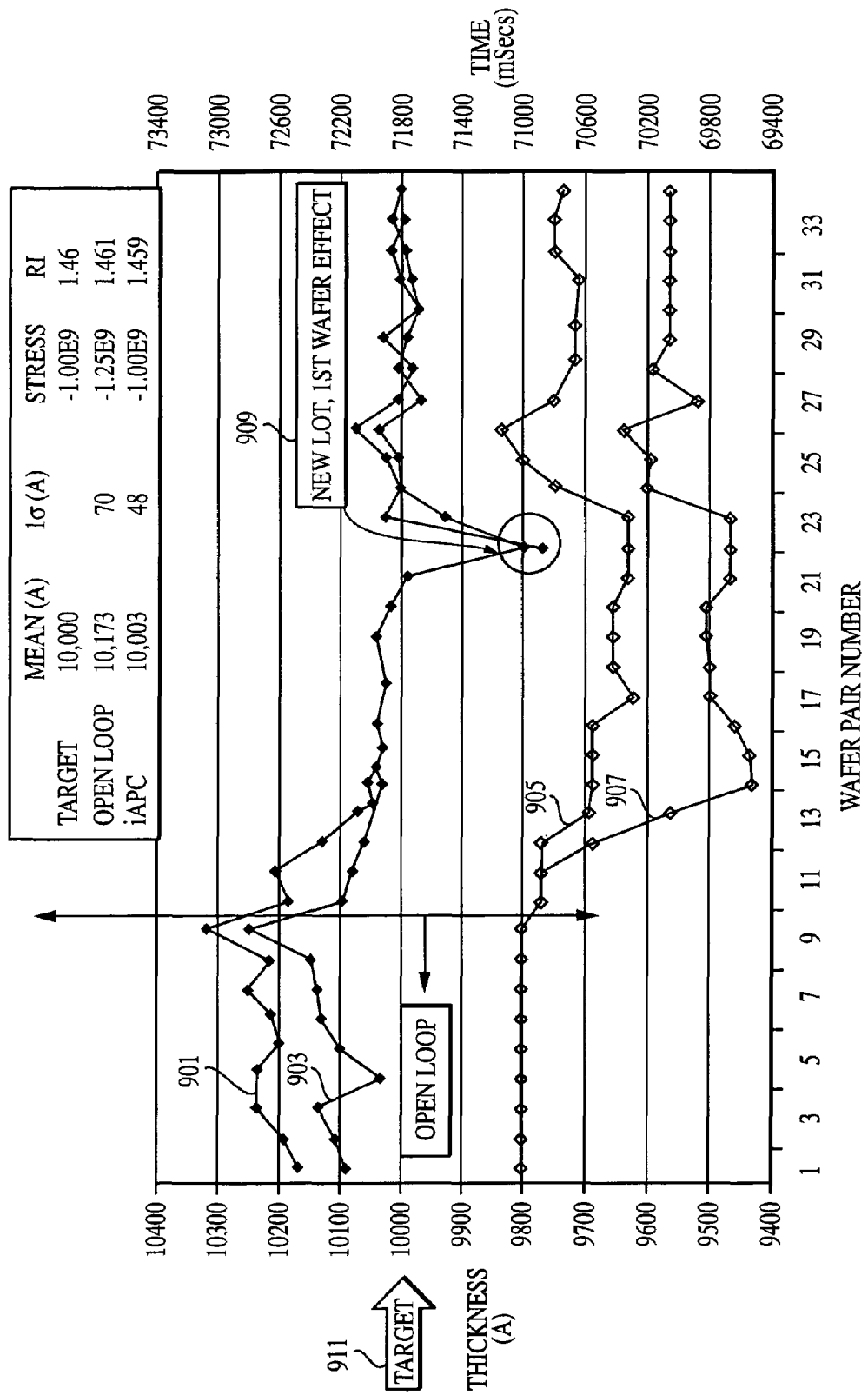
FIG. 9 is a line graph illustrating test results of one or more embodiments of the present invention used for chamber matching on processing stations running a plasma enhanced chemical vapor deposition (PECVD) undoped silicate glass (USG) process.

Reference is made to FIG. 9, a graph illustrating an example of matching of different processing stations. This data was generated by a Producer (™) tool running a PECVD USG (plasma enhanced chemical vapor deposition undoped silicate glass) process, and shows film thickness data. The left station thickness 903 and right station thickness 901 converge to within 20 angstroms after about 15 wafer pairs. The RF (radio frequency) processing time 905, 907 in the left 905 and right 907 chambers is adjusted after nine wafer pairs are processed. (An adjustment of the RF processing time will affect the wafer thickness.) There is a target thickness mean, in this case, of 10,000 angstroms, hence, the indicated target film thickness 911 is 10,000 angstroms. The open loop result, i.e., with no process control, is 10,173 angstroms; with process control, the result is 10,003 angstroms. As is illustrated by the graph, without use of the present invention, the mean thickness is 173 angstroms too high. On the other hand, using an embodiment of the present invention, the result is well within tolerances. The standard deviation without the invention is 70, whereas with an embodiment of the invention it is 48, a smaller and therefore more desirable number.

As illustrated in FIG. 9, embodiments of the invention were used to match the film thickness between the left and right processing station of the same chamber. The chamber had two processing stations internally that were matched using an embodiment of the invention, to match the results of the left processing station with the right station. The results of those two processing stations were brought into convergence toward each other and toward the target results utilizing the invention. This example illustrates one possible use of the invention to do left-to-right matching, within the same chamber. One or more embodiments of the present invention also contemplate chamber-to-chamber matching, and similar results including convergence are anticipated.

There are up to three chambers on a typical Producer (™) tool; therefore there are up to six processing stations. So using one or more embodiments of the present invention, one could cause any combination of two or more of those processing stations, even all six processing stations, to converge to the target. Other tools with which the invention might be used might have any number of chambers, with single, double or more wafer processing capacity. The measured stress results are an indication of film integrity. If there is a high stress in the film, the film is more likely to crack or peel or have other defects; hence, typically there is a target stress value as well as a target thickness. There is also a target refractive index (RI) value. While adjusting the thickness under control it is preferable not to negatively affect some other target film property such as stress or RI.

The results in the graph of FIG. 9 confirm that although the thickness is converging to the target value, this did not have any detrimental impact on the stress or the RI. To the contrary, the data shows that the embodiments of the present invention used to generate the data in FIG. 9 favorably tightened the distribution on both the stress value and RI value as well as the thickness. Use of the invention resulted in data closer to the target results.

The left axis of the graph shows thickness measurements in angstroms that are taken from wafer pairs from different matched chambers. The right axis shows processing time consumed for RF processing of each wafer, the processing time being the parameter that is being adjusted.

The RF time, 905, 907 begins at 71,000 milliseconds. Both left and right RF time 905, 907 are the same initially because the invention is operating under open loop conditions and so is not making any adjustments. During open loop conditions, all wafers use the same RF time. When the embodiments of the present invention depicted in FIG. 9 began running adjustments at wafer pair number 9, adjustments were made to the RF time between the left and right processing station, and hence the graph shows a difference in processing time.

In order to match these two chambers, the system adjusts the right and left RF time 905, 907 in the right and left chambers, respectively, to make the selected adjustment. The graph illustrates the right RF time 907 after wafer pair number 9 coming down to 69,400, then oscillating around 69,800 after wafer pair number 16. The left RF time 905 is still staying up around 70,600 milliseconds after wafer pair number 14.

Still referring to FIG. 9, the two sets of data showing right and left thickness 901, 903 on the top part of the graph begin with wafer pair number 1; there is a difference in thickness, exhibited out to about wafer pair number 13. The reason for the initial difference is that the system is running in open loop mode for the first ten wafer pairs. When the present embodiments of the invention begin making adjustments at wafer pair number 10, the thickness measurements converge about three wafers thereafter. Then once it is converged by about wafer pair number thirteen, the two lines, and hence the left and right thickness 901, 903 are tracking each other.

When new lot 909 is introduced a first wafer effect is created and the system needs to recalibrate itself. This may take two or three wafers.

In this particular example, the system can affect the RF time to adjust the film thickness. (RF is a wafer treatment for depositing film wherein the chamber energizes certain gases therein for a period of time to cause the deposition of film on the wafer.) In other types of processing, other model or recipe parameters would be adjusted to achieve desired different results. Although the example of FIG. 9 is PECVD of USG film, it should be understood that the present invention may be used with any type of process tool and/or other components, with other types of processing, and/or with other adjustments, as would be understood by one of skill in this art, to achieve desired results. However, the invention is not limited to the types of chambers and processing (or other necessary specific results or criteria) which are provided herein by way of example, and these examples are not intended to be exhaustive.

Figure 10:
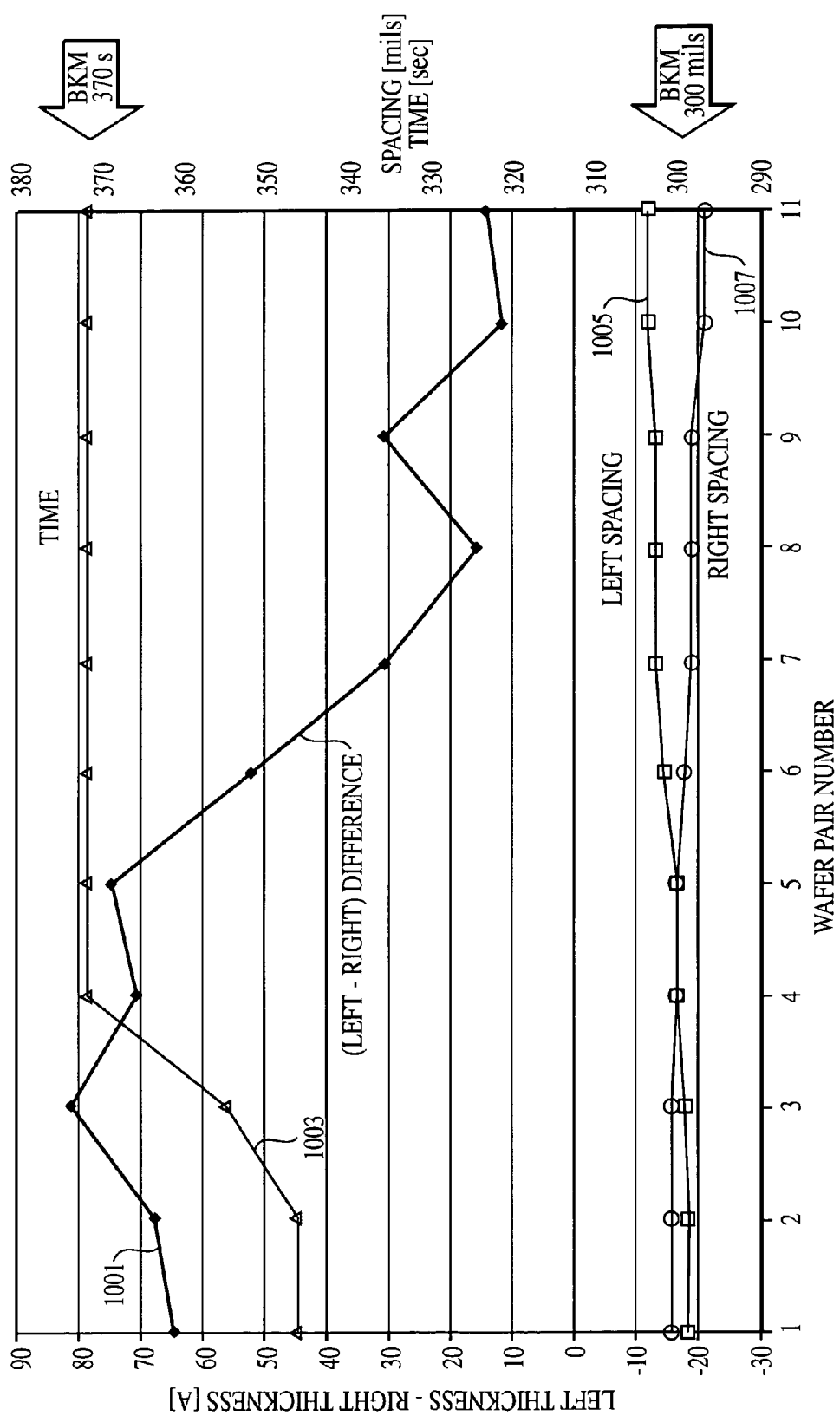
FIG. 10 is a line graph illustrating test results of one or more embodiments of the present invention in connection with chamber matching on processing stations running a subatmospheric chemical vapor deposition (SACVD) USG process.

Reference is made to FIG. 10, illustrating the invention as applied in an example using another alternative embodiment to a different type of process tool, here a Sub-Atmospheric Chemical Vapor Deposition (SACVD) process tool. This example uses a different kind of hardware to deposit the same film, illustrating that one or more embodiments of the present invention can apply to multiple types of processes and multiple types of films. The typical mismatch between the left and right processing station in this example is around 70 angstroms. The graph shows the left-right difference 1001. The goal is for this difference 1001 to become or approach zero. FIG. 10 shows the difference 1001 approaching zero after closed loop control is initiated.

In this example, the spacing between the wafer and the shower head is being adjusted to achieve the match. In the previous example, time was adjusted to achieve the match. As shown in the graph of FIG. 10, the left spacing and right spacing 1005, 1007 are essentially the same up to wafer set number 5, and then they start to deviate. The Best Known Method (BKM) spacing 1003 or the recommended spacing is 300 mils. for either left or right side. In order to achieve a match of film thickness this embodiment of the invention used 303 mil for the left spacing 1005 and 297 mils for the right spacing 1007. One may observe from this that there are extremely minute but important changes in the wafer position, relative to the shower head such that a small amount of tweaking enables matching. The adjustment is very sensitive.

The APC determines the amount of adjustment to be made, according to one or more embodiments, by use of any available model that describes the process. One appropriate model that determines an adjustment is the iAPC configuration option, available from Applied Materials, in connection with tools sold under trademarks including Producer (™), Centura(™), Mirra (™), Reflexion (™) or Endura(™). According to one such model, the first wafer is run on the process tool and then the result is measured on the first wafer; the measured result is entered into the model. The model computes what the result should have been, compares it to the actual result, and determines a different set of processing conditions, if any, that would theoretically meet the target. That information includes an adjustment in the recipe for the next wafer. In the time it takes the robot to move the next wafer into the chamber, the calculations are done, the new recipe set point (including the adjustment) is determined, and the adjustment to the process tool is made.

Figure 11:
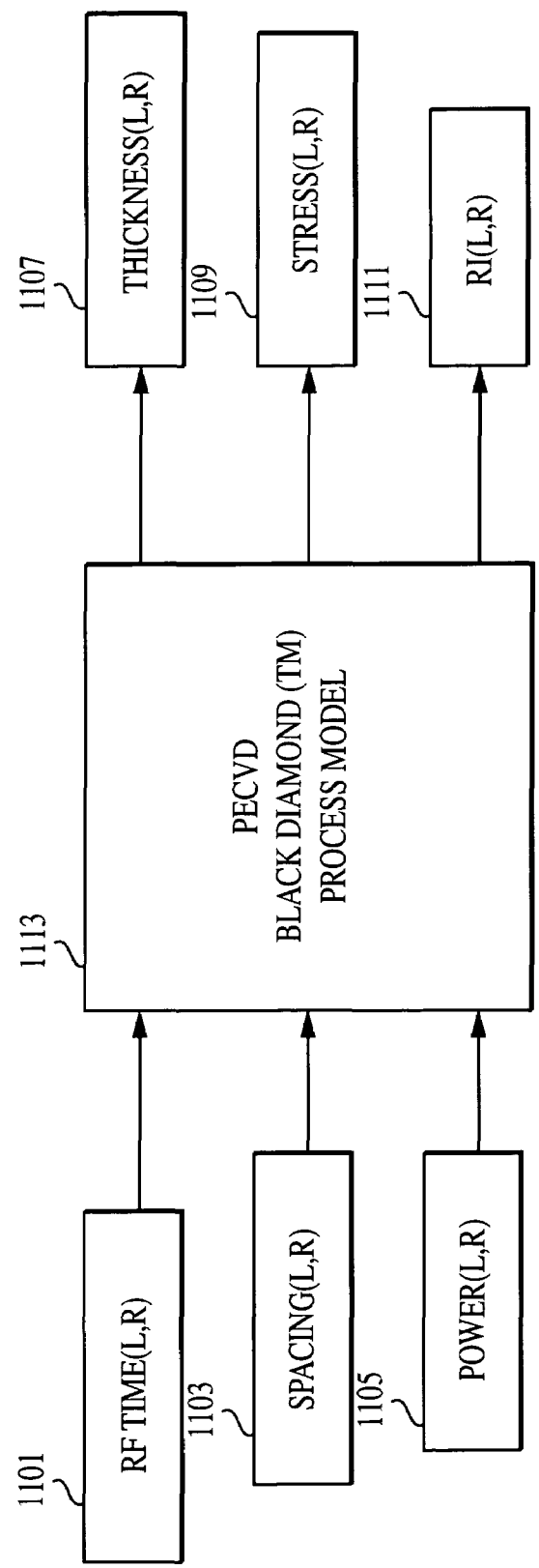
FIG. 11 is a block diagram illustrating inputs used to model a process for use in connection with one or more embodiments of the present invention, together with outputs.

Reference is made to FIG. 11. This is a block diagram illustrating typical input parameters and measured output for a Black Diamond (™) (available from Applied Materials) process, used for determining an appropriate adjustment in a recipe. The model 1113 simulates for a given inputted value of RF time 1101, spacing 1103, and power 1105, the resulting film thickness 1107, stress 1109, and refractive index 1111.

A unique model is built for each process and subsequently stored and made available for later reference. Hence, the model illustrated here would be different for other devices. For example, the input parameters could differ. On an etch tool, as one example, the typical adjusted parameters could include RF time, power, and/or one or more gas flow rates. There might be three or four or even more different input parameters, and likewise the outputs that are measured will differ. These and other models for determining adjustments are commercially available, as mentioned above.

Figure 12:
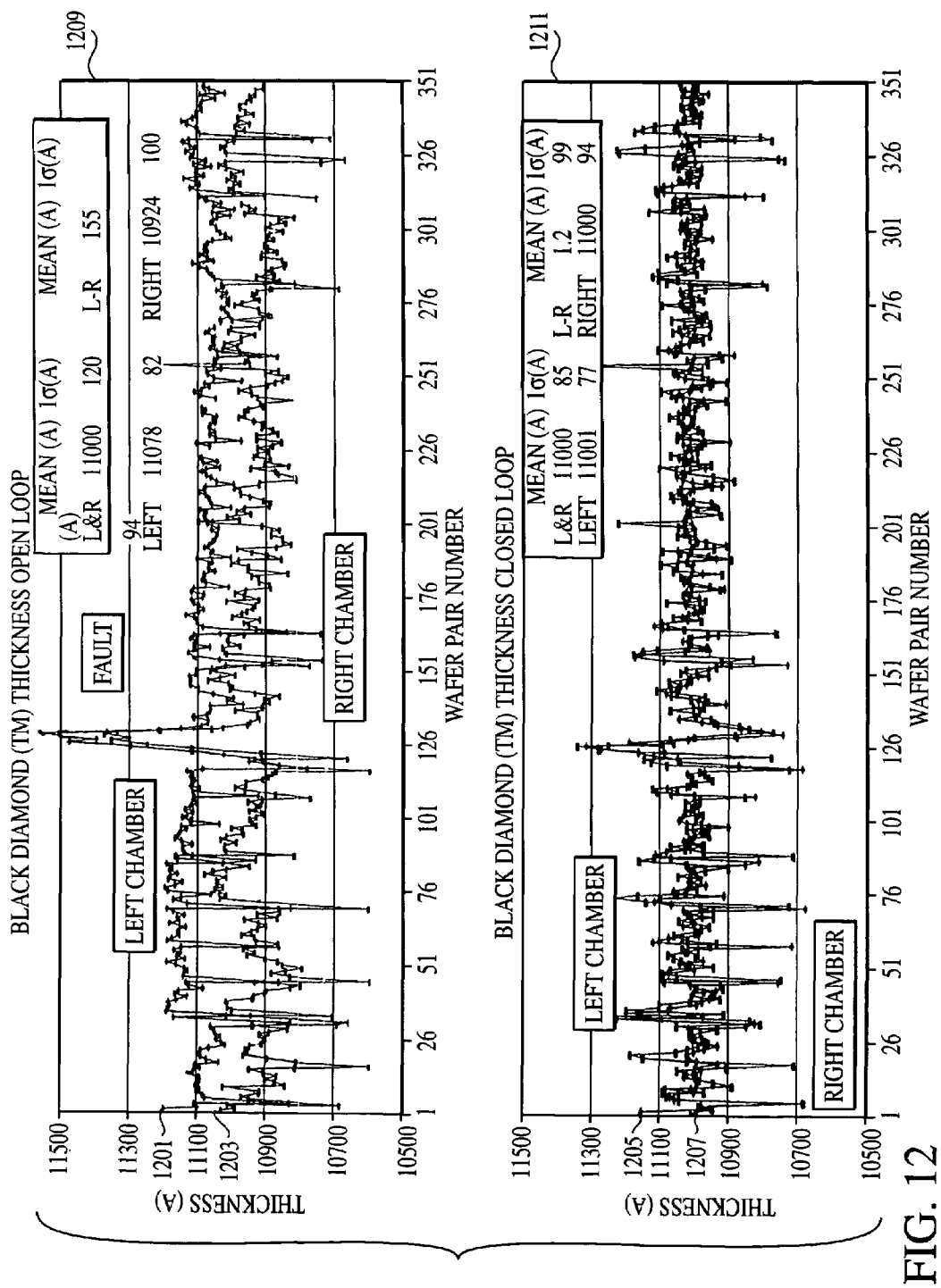
FIG. 12 is a line graph illustrating simulated results of one or more embodiments of the present invention in connection with chamber matching on processing stations running Black Diamond (™) film on a PECVD processor showing open loop vs. closed loop runs.

Reference is made to FIG. 12, showing a simulated example Black Diamond (™) process, with open loop and closed loop data. This simulation illustrates that closer chamber matching is possible with closed loop control. In this particular example, 351 pairs were run through the simulated invention. A left chamber 1201 and right chamber 1203 are run under open loop conditions 1209. The left and right mean is 11,000 angstroms, the standard deviation is 120, and the left to right mean in angstroms is 155. In contrast, a left chamber and right chamber 1205, 1207 run under closed looped conditions 1211 yield a left and right mean of 11,000 angstroms, a standard deviation of 85, a left to right mean of 1.2 angstroms, and a standard left to right deviation of 99; the left mean is 11,001 angstroms, the standard deviation is 77, the right mean is 11,000 angstroms, and the right standard deviation is 94.

Figure 13:
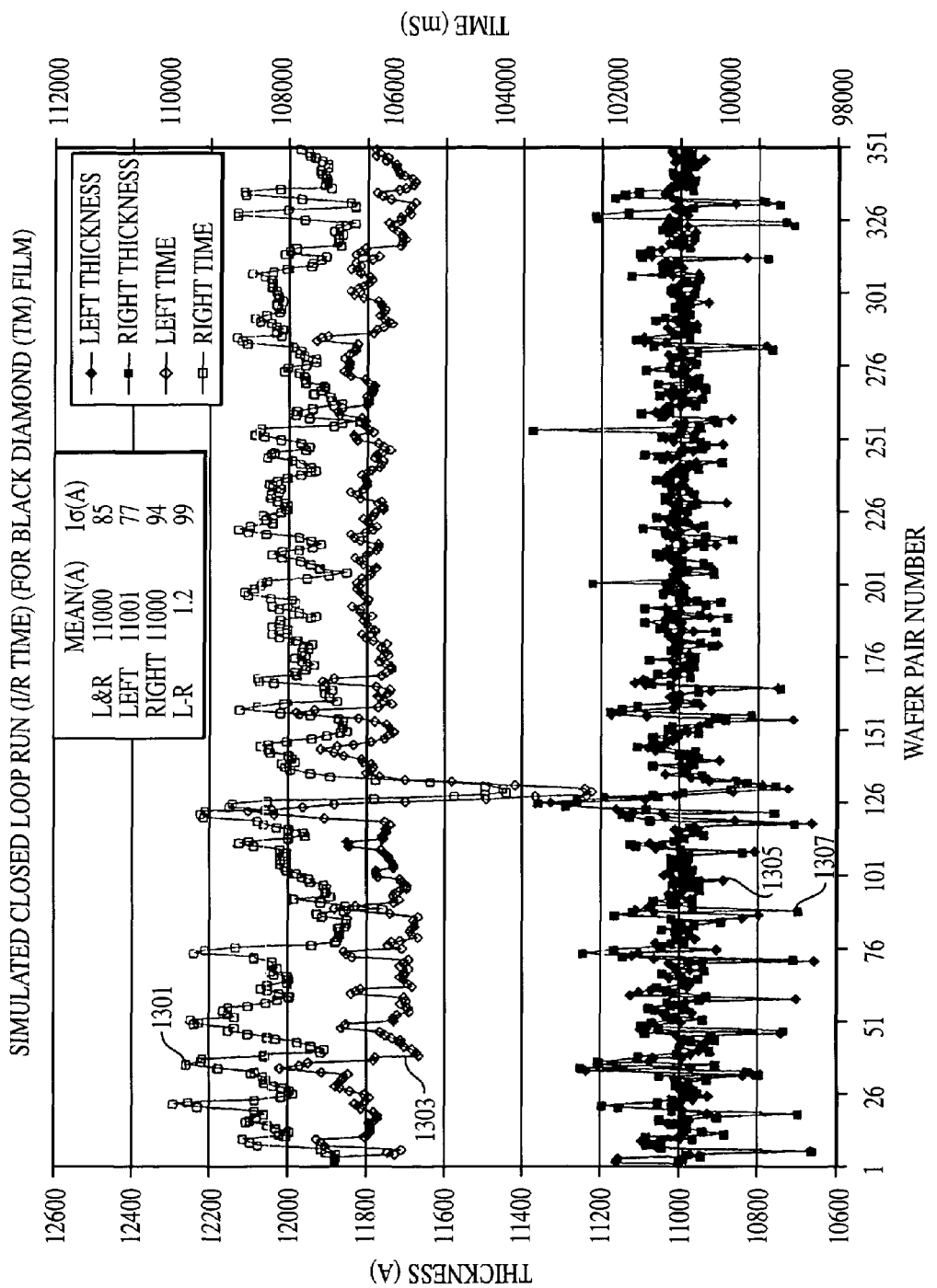
FIG. 13 is a line graph illustrating simulated predicted results for use of one or more embodiments of the present invention in connection with a closed-loop run of Black Diamond (™) film on the PECVD processor.

Reference is made to FIG. 13 illustrating a simulated closed loop run, with RF time adjusted, of Black Diamond (™) film thickness. This graph illustrates the right and left time 1301, 1303, as well as the left and right thickness 1305, 1307, under simulated closed loop run conditions. As is illustrated, the left and right mean is 11,000 angstroms, and the standard deviation is 85; the left mean is 11,001 and the left standard deviation is 77, the right mean is 11,000 angstroms, the right standard deviation is 94, the left to right mean is 1.2 angstroms, and the left to right standard deviation is 99. This illustrates that left and right chamber matching is achieved by continuous RF time control.

Figure 14:
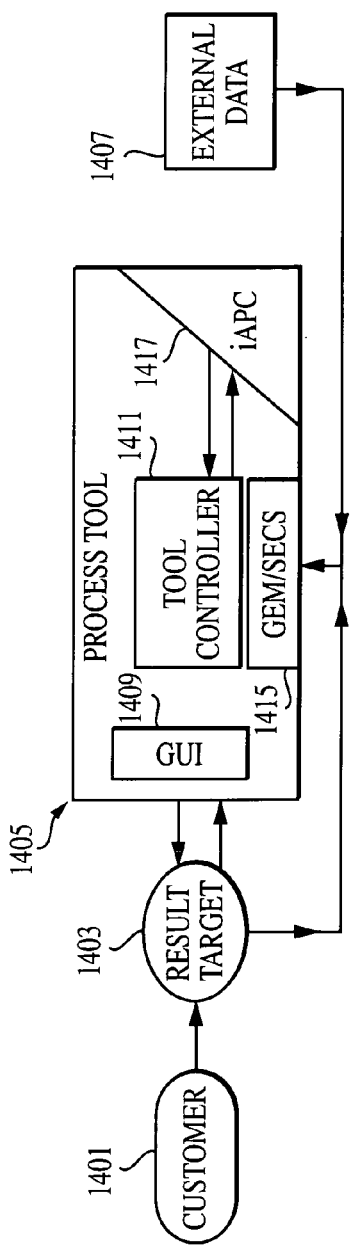
FIG. 14 is a block diagram illustrating one process tool for use in connection with one or more embodiments of the present invention.

Reference is now made to FIG. 14, illustrating a block diagram of a process tool with integrated automatic process control (APC), as envisioned for use with one or more embodiments of the present invention. As is illustrated here, according to one or more embodiments of the present invention, an APC 1417 is included at least in part on a particular process tool 1405, and is used to optimize the wafer results by controlling operational performance of a process tool 1405, using model based control. The APC includes data collection, appropriate hardware and software models to enable the process tool to operate as desired. A customer 1401 will supply its desired wafer result target(s) 1403 to the process tool 1405. The result target(s) 1403 will be incorporated into the processing by the APC 1417, which will drive the tool controller 1411 in order to obtain the result target. The APC obtains (and/or shares) behavior information and attempts to converge the results of the process tool to the target utilizing the behavior information to adjust the processing parameters. Note that appropriate communications devices may optionally be included, in this illustrated embodiment including generic equipment model ("GEM")/SECS interface 1415 and/or a graphical user interface (GUI) 1409. Additionally, if desired, external data 1407 can be taken into account as input by the process tool 1405.

Figure 15:
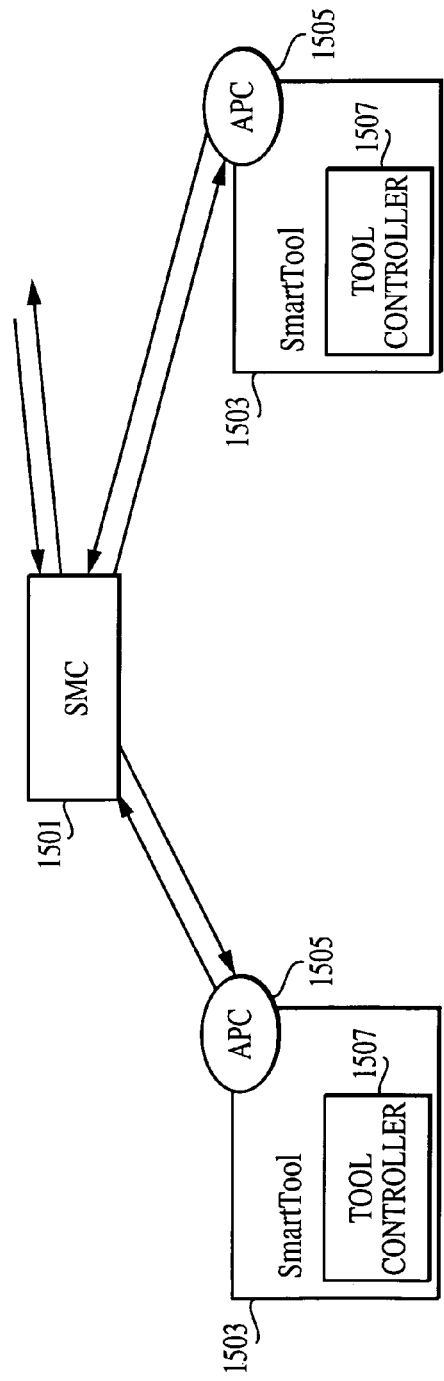
FIG. 15 is a block diagram illustrating two process tools for use with one or more embodiments of the present invention.

Reference is now made to FIG. 15, showing a block diagram of one or more embodiments of the present invention used with an optional separate module control ("SMC"). The SMC contains module level models that provide for automatically setting process tool results targets, for example in a multi-tool environment. As illustrated, multiple process tools 1503 such as smart tools (i.e. having embedded computer intelligence) are included. Each of the process tools 1503 in this example includes an APC 1505, which enables the process tool 1503 to become part of a process module, and a tool controller 1507. The APC obtains (and/or shares) behavior information and attempts to converge the results of the process tool to the target utilizing the behavior information to adjust the processing parameters.

Figure 16:
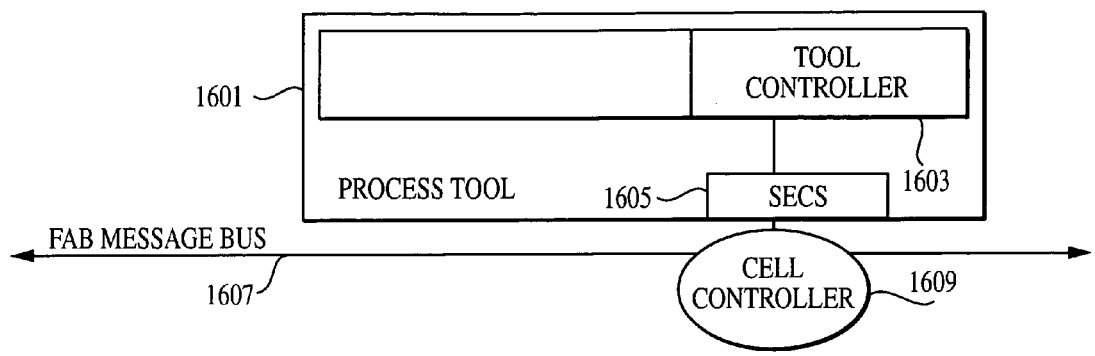
FIG. 16 is a block diagram illustrating a process tool communicating with a controller for use in connection with one or more embodiments of the present invention.
Figure 17:
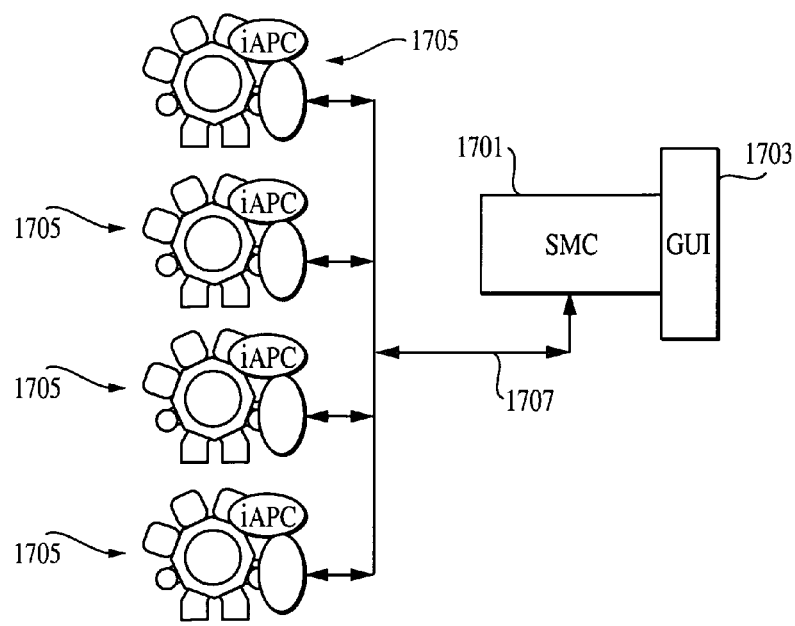
FIG. 17 is a block diagram illustrating multiple peer process tools controlled by a controller for use in connection with one or more embodiments of the present invention.

Reference is now made to FIG. 16, a block diagram illustrating top level control for one or more embodiments of the present invention. The process tool 1601 includes a tool controller 1603, as well as a SECS 1605, communicating to a cell controller 1609. The cell controller communicates with other devices via a fab message bus 1607. Multiple process tools and/or devices of other types may be connected together via a fab message bus. Moreover, the fab message bus may communicate with a fab controller providing overall control over an assembly line. Communications include, inter alia, behavior information used to coverage processing results. The benefits of tool level control are that the tool monitoring is embedded, which allows a high level performance on control. Further, this enables automatic process results, rather than trial-and-error or manual process parameter settings. Additionally, this enables enhanced process tool performance both on a wafer-to-wafer level and a within-wafer level, together with integrated metrology. Standard interfaces may be utilized to allow monitoring of data. Reference is now made to FIG. 17, a block diagram illustrating a multiple tool level control over peer process tools that may be used in connection with one or more embodiments of the invention. An SMC 1701 is provided to control multiple peer tools 1705, that is, process tools of a similar type. As illustrated, these peer tools are capable of being configured in a comparable manner. The SMC 1701 communicates with the peer tools 1705 via a message bus 1707. This allows for unified control over any porting of models, remote viewing of the process tools, and results matching from chamber to chamber and/or process station to station, regardless of process tool, as well as from tool to tool. The level of commonality of the chambers and the results can be analyzed, preferably by the SMC 1701. Further, the productivity can be matched and the throughput can be balanced by appropriate control in accordance with one or more embodiments of the invention. Optionally, the SMC 1701 includes GUI 1703 interface.

Figure 18:
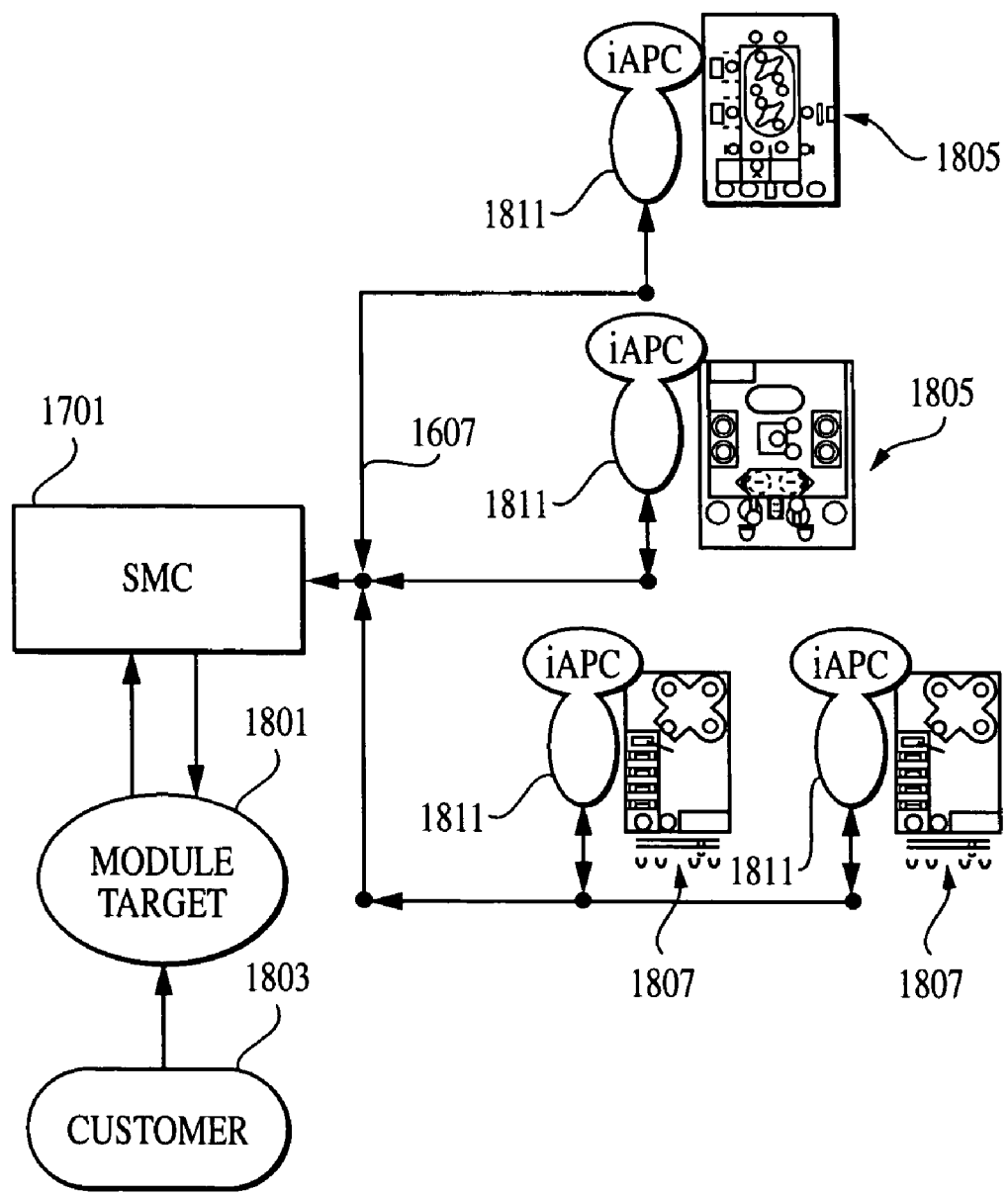
FIG. 18 is a block diagram illustrating multiple process tools, including different types of peers, controlled by a controller for use with one or more embodiments of the present invention.

Reference is made to FIG. 18, a block diagram illustrating multiple tool level control that may be used in connection with one or more embodiments of the present invention. Here, the SMC 1701 communicates to the process tools 1805, 1807 via the fab message bus 1607 communicating with an APC 1811 on each process tool 1805, 1807. The customer 1803 provides the module target 1801 to the SMC 1701. The SMC utilizes its typical process models in order to determine the recipes that should be loaded onto each of the process tools 1805, 1807. The SMC can adjust each process tool recipe in order to achieve a particular result target. The SMC can also enable chamber matching across the various different types of process tools 1805, 1807.

Figure 19:
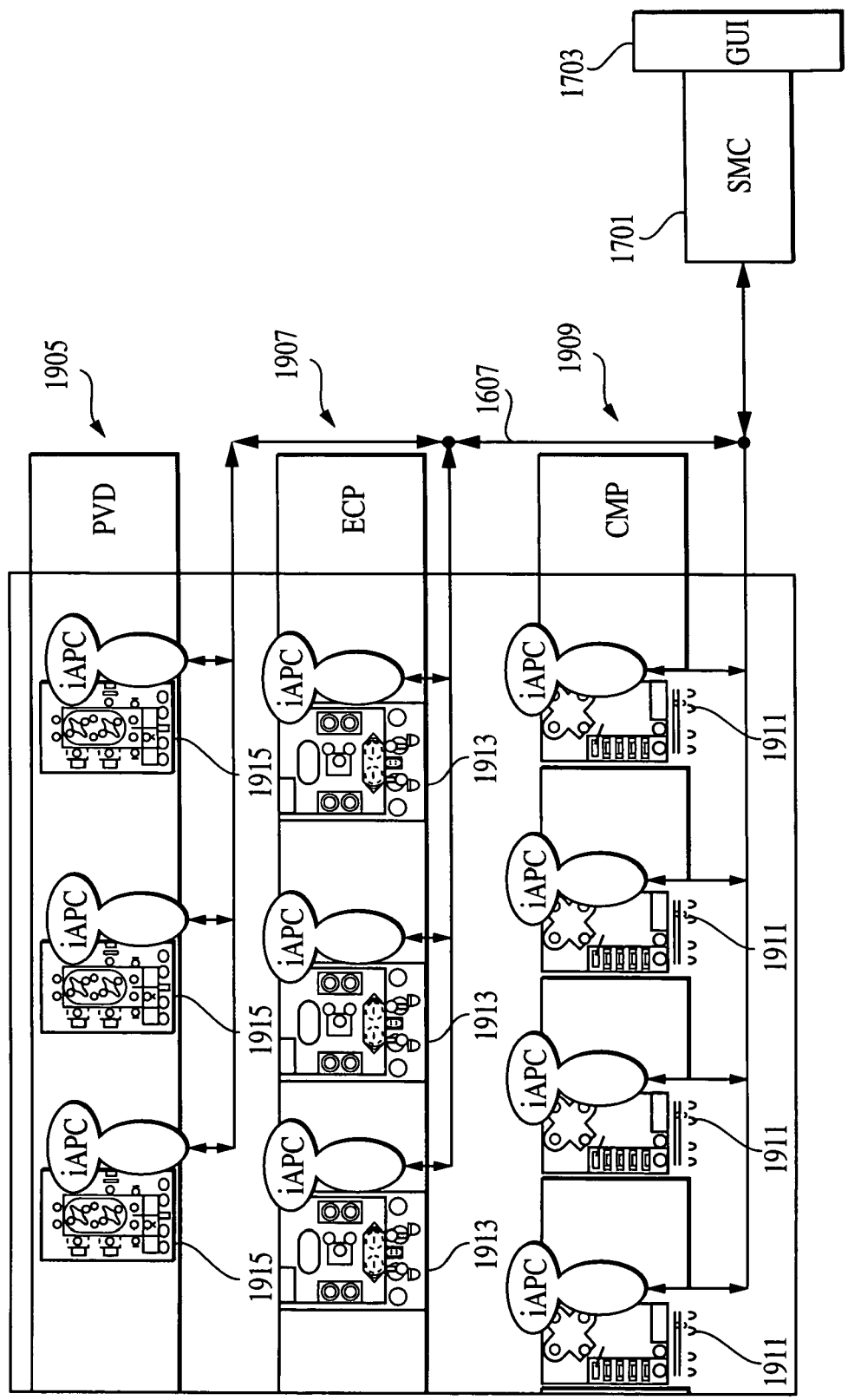
FIG. 19 is a block diagram illustrating a process module and various applications of one or more embodiments of the present invention.

Reference is now made to FIG. 19, a block diagram illustrating a system having a process module application, which may be used with one or more embodiments of the present invention. The illustrated system includes an SMC 1701 with optional GUI 1703, communicating with various process tools 1911, 1913, 1915 via a fab message bus 1607. An assembly line is provided, including a chemical mechanical polisher ("CMP") 1909, electrico-chemical platter ("ECP") 1907 and physical vapor deposition ("PVD") 1905. Chambers can be matched across process tools that are of the same type, in order to permit assembly line processing through the CMP, ECP and PVD tools. More or fewer tools, or tools of different types and/or configurations, could be implemented in other embodiments.

Figure 20:
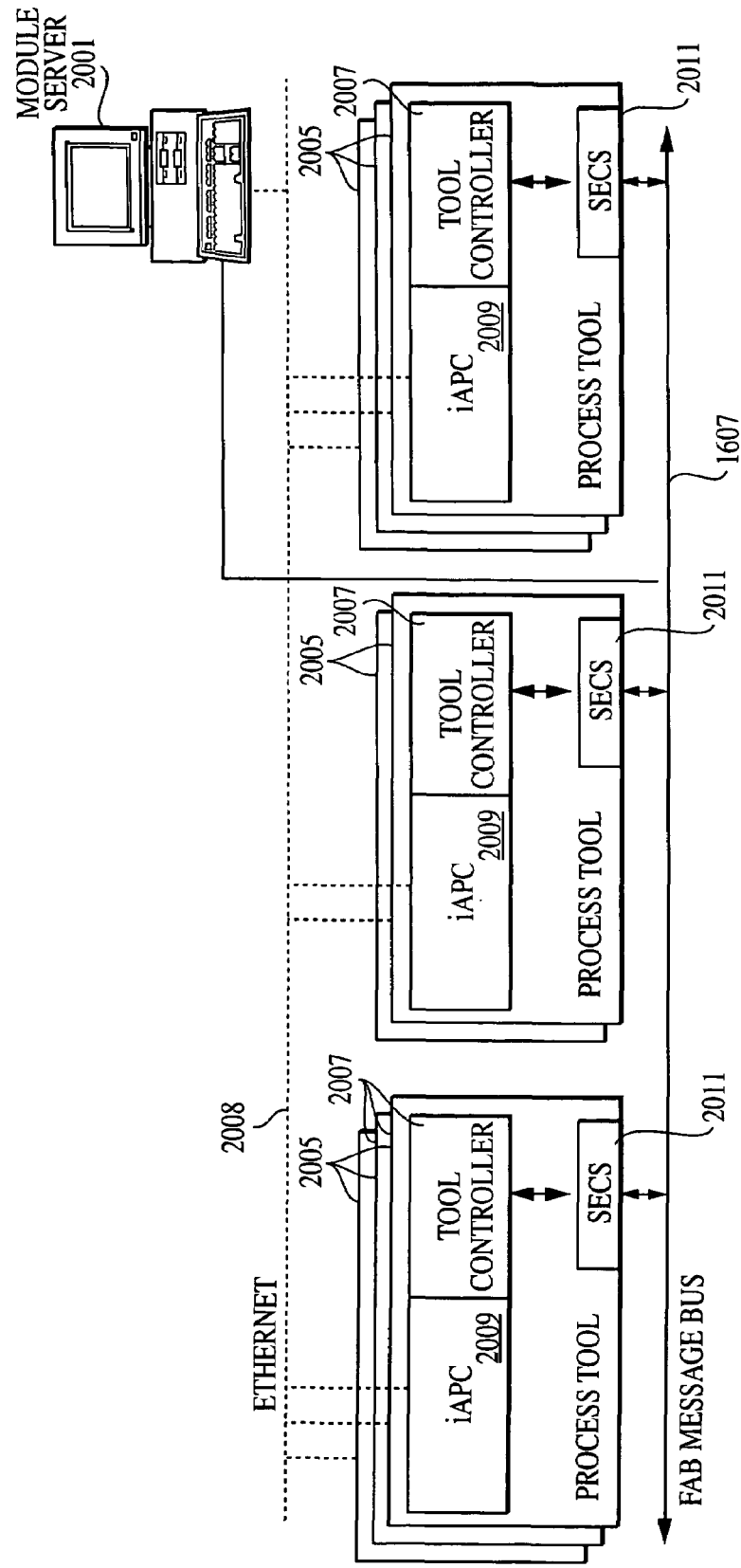
FIG. 20 is a block diagram illustrating process module level control for use in connection with one or more embodiments of the present invention.

Reference is now made to FIG. 20, a block diagram illustrating a system having process module level control for use in connection with one or more embodiments of the invention. A controller 2001 is provided, in this example, a module server on a computer. The controller 2001 communicates with the process tools 2005 via a fab message bus 1607, using SECS protocol 2011. Alternatively, the module server may communicate with the APC 2009 via a network connection such as an Ethernet network 2008. In this illustration, there are provided multiple process tools 2005 connected directly or indirectly to the controller 2001.

Figure 21:
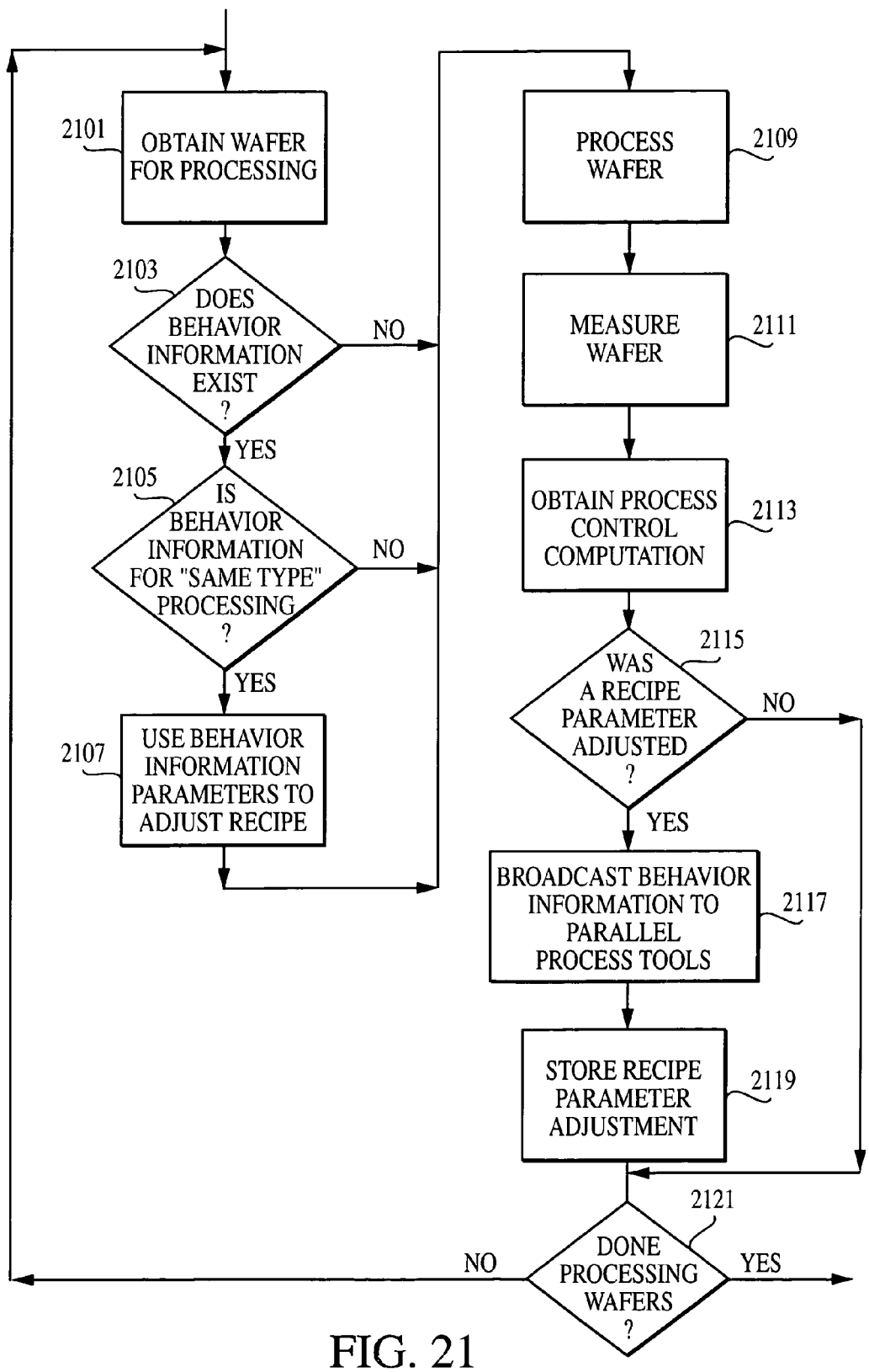
FIG. 21 is a flow chart illustrating a portion of the control processing in accordance with one or more embodiments of the invention.

Reference is now made to FIG. 21, a flow diagram for one or more embodiments of the invention, showing the processing at the process tool level. This example could be executed, for example, on the processing devices corresponding to that shown in FIG. 4 and FIG. 6. Here, at step 2101, the process tool obtains a wafer for processing. At step 2103, the process tool (or controller, such as process tool controller or process controller) checks whether behavior information exists for this process tool. At step 2105, the process tool (or other controller) checks whether the behavior information is appropriate for this type of processing. The "same type" process could be, for example, the identical processed device, or a same recipe (or recipe combination) used for this processing step even if the ultimate processed device is different.

According to one or more embodiments, steps 2103 and 2105 are also executed when the process tool detects that it has switched to processing a new type of device. If for example the process tool was an etch device, it would detect that it received a new family of recipes, as a result of a user instructing the fab as to the family of recipes to use for that step. The etch recipe can then be tuned, if behavior information exists, to the appropriate recipe for the new product. This allows the system to more quickly characterize and optimize the performance of a process tool.

The behavior information has been provided in some manner, such as a broadcast from a parallel processing tool, or central storage for example. If there is appropriate behavior information, at step 2107, the process tool uses the behavior information and parameters to adjust the recipe. By use of behavior information, the process tool "learns" and applies the learning from prior processing that is sufficiently similar or analogous to the current processing.

At step 2109, the process tool processes the wafer in accordance with the recipe, which may have been adjusted to take into consideration available behavior information. At step 2111, the process tool (or other metrology tool) measures the wafer as usual. At step 2113, having obtained the metrology results, the process tool obtains a process control computation, probably from the process controller. The process control computation, discussed above, may be provided in any appropriate manner, and is intended to adjust the processing to be closer to specification. Process control computations are available to those skilled in the art.

At step 2115, the process tool determines whether a recipe parameter was adjusted. This could be determined, for example, because the process tool received an adjusted parameter, or received a new recipe. If the recipe parameter was adjusted, the process tool broadcasts the recipe parameter adjustment to parallel process tools at step 2117. The broadcast could be accomplished, for example, by transmitting the adjusted recipe and/or adjusted recipe parameters to the process controller, which then broadcasts the adjustment to parallel process tools. Alternatively, if the process tools communicate with each other, the adjustment could be broadcast directly to the parallel process tools. As a further alternative, the recipe adjustments (behavior information) could be stored centrally, and could be accessed by each process tool. The adjusted recipe parameter is also stored at the process tool, at step 2119. The process tool determines whether it is done processing wafers at step 2121, and if not, it loops back to obtain the next wafer for processing at step 2101.

In connection with the flow chart of FIG. 21, it will be noted that conventional methods can be provided for avoiding collisions between behavior information. If there is a collision, for example, the system could take most recent data, or data having results closest to target, or data from highest numbered process tool, or any combination of the foregoing. It is possible to provide for allocation and de-allocation of storage at appropriate points in the flow chart, if more sophistication is desired. Further, it will be appreciated that the broadcast of behavior information could be provided in a number of ways. For example, a simple transmission could be in accordance with any utilized communication protocol between process tools and/or process controller(s). Moreover, a broadcast of behavior information data could be provided to local and/or remote process tools, even over the Internet. Hence the invention is not necessarily limited to use in a single fab, and indeed the broadcast data could be transmitted among multiple fabs and/or customers and/or users if desired.

While this invention has been described in conjunction with the specific embodiments outlined above, many alternatives, modifications and variations will be apparent to those skilled in the art. Accordingly, the preferred embodiments of the invention as set forth are intended to be illustrative and not limiting. Various changes may be made without departing from the spirit and scope of the invention as defined in the following claims.

The invention has been described in connection with specific process tools, although other examples of process tools have been provided. It is not intended to limit the invention to these specified process tools. More specifically, this invention is intended to accommodate any process tool, including any type of process tool used in manufacturing semi-conductors.

As another example, the advanced process control may be implemented on a general purpose computer or on a specially programmed computer. It may also be implemented as a distributed computer system, rather than a single computer system. Further, some of the distributed systems might include embedded systems; the programming may be distributed among processing devices and/or metrology tools and/or other parts of the process control system.

Similarly, the processing may be controlled by software on one or more computer systems and/or processors and/or process tools, or could be partially or wholly implemented in hardware. Moreover, the advanced process control may communicate directly or indirectly with relevant metrology tools and processing tools, or the metrology tools and processing tools may communicate directly or indirectly with each other and the advanced process control.

Further, the invention has been described as being implemented on a closed network. It is possible that the invention could be implemented over a more complex network, such as an Intranet, the Internet, or it could be implemented on a single computer system. Moreover, portions of the system maybe distributed (or not) over one or more computers, and some functions maybe distributed to other hardware, such as tools, and still remain within the scope of the invention.

What is claimed is:

1. A computer-implemented method comprising:
 (A) collecting data representative of one or more behaviors of at least one of one or more semi-conductor processing entities, said one or more behaviors being collected in the course of the one or more semi-conductor processing entities converging to, or attempting to maintain proximity with, a target setting; and
 (B) sharing information, relating to the data representative of the one or more behaviors, between at least one of the one or more semi-conductor processing entities and at least one comparably configured semi-conductor processing entity, wherein the sharing of the information facilitates the at least one comparably configured semi-conductor processing entity receiving the information to adjust a recipe that enables the at least one comparably configured semi-conductor processing entity to converge to, or attempt to maintain proximity with, the target setting.

2. The method of claim 1, wherein the sharing of the information is performed on a wafer-to-wafer basis.

3. The method of claim 1, wherein the sharing of the information is performed on a run-to-run basis.

4. The method of claim 1, wherein the sharing of the information is performed on the same processing entity, at a time substantially later than a time at which the data was collected.

5. The method of claim 1, wherein the sharing of the information is performed on a different processing entity, at a substantially later time, or a substantially same time at which the data is collected.

6. The method of claim 1, wherein the step of collecting data includes measuring at least one device processed by one or more of the semi-conductor processing entities, and wherein the step of sharing includes adjusting a process parameter for the at least one comparably configured semi-conductor processing entity subsequent to measuring of the at least one device and prior to processing of a next device.

7. The method of claim 1, wherein the step of collecting data includes measuring at least one device in a batch of devices processed by one or more of the semi-conductor processing entities, and wherein the step of sharing includes adjusting a process parameter for the at least one comparably configured semi-conductor processing entity subsequent to measuring of the batch and prior to processing of a next batch.

8. The method of claim 1, wherein the at least one comparably configured semi-conductor processing entity resides on a same tool as said one or more semi-conductor processing entities.

9. The method according to claim 8, wherein the at least one comparably configured semi-conducting processing entity comprises a chamber.

10. The method according to claim 9, wherein the chamber comprises two or more processing stations.

11. The method of claim 1, wherein the at least one comparably configured semi-conductor processing entity and said one or more semi-conductor processing entities reside on separate tools.

12. The method according to claim 11, wherein the at Least one comparably configured semi-conductor processing entity comprises a chamber.

13. The method according to claim 12, wherein the chamber comprises two or more processing stations.

14. The method of claim 1, wherein at least one of the one or more semi-conductor processing entities includes an integrated metrology tool.

15. The method of claim 1, further comprising the step of providing a separate metrology tool for at least one of the one or more semi-conductor processing entities.

16. The method of claim 1, further comprising the step of controlling at least one of the one or more semi-conductor processing entities from a controller.

17. The method of claim 1, wherein the at least one comparably configured semi-conductor entity comprises a module.

18. The method of claim 17, wherein the module comprises a chamber.

19. The method of claim 18, wherein the chamber comprises a processing station.

20. The method according to claim 1, wherein the at least one comparably configured semi-conductor processing entity is configured the same as said one or more semi-conductor processing entities.

21. A computer program product residing on a computer readable medium the computer program product comprising instructions for enabling a computer to:
(A) collect data representative of one or more behaviors of at least one of one or more semi-conductor processing entities, said one or more behaviors being collected in the course of the one or more semi-conductor processing entities converging to, or attempting to maintain proximity with a target setting; and
(B) share information, relating to the data representative of the one or more behaviors, between at least one of the one or more semi-conductor processing entities and at least one comparably configured semi-conductor processing entity, wherein the information facilitates the at least one comparably configured semi-conductor processing entity receiving the information to adjust a recipe that enables the at least one comparably configured semi-conductor processing entity to converge to, or attempt to maintain proximity with the target setting.

22. The computer program product of claim 21, wherein the instructions for sharing of the information are performed on a wafer-to-wafer basis.

23. The computer program product of claim 21, wherein the instructions for sharing information are performed on a run-to-run basis.

24. The computer program product of claim 21, wherein the instructions for sharing information are performed on a same tool, at a time substantially later than a time at which the data was collected.

25. The computer program product of claim 21, wherein the information is provided from a first tool, to a second tool at a substantially later time, or a substantially same time at which the data is collected.

26. The computer program product of claim 21, wherein the instructions for collecting data include instructions for measuring at least one device processed by at least one of the one or more semi-conductor processing entities, and wherein the instructions for sharing include instructions for adjusting a process parameter for the at least one comparably configured semi-conductor processing entity subsequent to measuring of the at least one device and prior to processing of a next device.

27. The computer program product of claim 21, wherein the instructions for collecting data include instructions for measuring at least one device in a batch of devices processed by at least one of the one or more semi-conductor processing entities, and wherein the instructions for sharing include instructions for adjusting a process parameter for the at least one comparably configured semi-conductor processing entity subsequent to measuring of the batch and prior to processing of a next batch.

28. The computer program product of claim 21, wherein the at least one comparably configured semi-conductor processing entity comprises a first chamber and a second chamber.

29. The computer program of claim 21, wherein the at least one comparably configured semi-conductor processing entity is on a tool separate from the one or more semi-conductor processing entities.

30. The computer program product of claim 21, wherein at least one of the one or more semi-conductor processing entities includes an integrated metrology tool.

31. The computer program product of claim 21, further comprising instructions for providing a separate metrology tool for at least one of the one or more semi-conductor processing entities.

32. The computer program product of claim 21, further comprising instructions for controlling at least one of the one or more semi-conductor processing entities from a controller.

33. A computer-implemented method of converging, to a target setting, processing results of two or more comparably configured semi-conductor processing entities, comprising:
obtaining, for one of the comparably configured semi-conductor processing entities, a recipe to be utilized in conjunction with processing a product;

measuring at least one product characteristic subsequent to processing;

adjusting at least one recipe parameter based upon said measuring step;

providing the at least one recipe parameter to at least one other comparably configured semi-conductor conductor processing entity; and utilizing the at least one recipe parameter to adjust a recipe of at least one other comparably configured semi-conductor processing entity and converge the processing results of the one comparably configured semi-conductor processing entity with the at least one other comparably configured semi-conductor processing entity.

34. The computer-implemented method according to claim 33, wherein the two or more comparably configured processing entities comprise tool chambers.

35. The computer implemented method according to claim 34, wherein a first tool chamber is on a first tool and a second tool chamber is on a second tool.

36. The computer implemented method according to claim 35, wherein the first tool chamber comprises a first and a second processing station and the second tool chamber comprises a third and a fourth processing station.

37. The computer implemented method according to claim 34, wherein a first tool chamber and a second tool chamber are on a same tool.

38. The computer implemented method according to claim 37, wherein the first tool chamber comprises a first and a second processing station and the second tool chamber comprises a third and a fourth processing station.

39. A computer-implemented system of converging, to a target setting, processing results generated by comparatively configured process tools operating in parallel in a semiconductor processing environment, said system comprising:

a module controller containing module level models for setting at least one process tool results target;

each of said comparatively configured process tools configured in parallel and communicating with said module controller, each of said comparatively configured process tools comprising an automatic process control module that receives as input from said module controller a module level model, wherein at least one of said respective automatic process control modules adjust at least one recipe processing parameter based on shared information from another automatic process control module to enable at least one of said comparatively configured process tools to converge to or maintain a respective process tool results target.

40. The system of claim 39, wherein said at least two process tools comprise embedded computer intelligence.

41. The system of claim 39, wherein said module controller comprises a graphical user interface.

42. The system of claim 39, wherein said automatic process control module comprises at least one of hardware and software.

43. The system of claim 39, wherein each of said at least two process tools further comprises a tool controller for processing a recipe to achieve said at least one process tool results target.

* * * * *